US012760417B2

(12) United States Patent
Wu et al.

(10) Patent No.: US 12,760,417 B2
(45) Date of Patent: Oct. 13, 2026

(54) ATOMIC LAYER DEPOSITION METHODS FOR MAKING OMNIDIRECTIONAL STRUCTURAL COLOR MULTILAYER STRUCTURES

(71) Applicant: Toyota Motor Engineering & Manufacturing North America, Inc., Plano, TX (US)

(72) Inventors: Songtao Wu, Ann Arbor, MI (US); Debasish Banerjee, Ann Arbor, MI (US); Minjuan Zhang, Ann Arbor, MI (US)

(73) Assignees: Toyota Motor Engineering & Manufacturing North America, Inc., Plano, TX (US); Toyota Jidosha Kabushiki Kaisha, Toyota (JP)

( * ) Notice: Subject to any disclaimer, the term of this patent is extended or adjusted under 35 U.S.C. 154(b) by 127 days.

(21) Appl. No.: 18/219,368

(22) Filed: Jul. 7, 2023

(65) Prior Publication Data

US 2025/0011928 A1 Jan. 9, 2025

(51) Int. Cl.
*C23C 16/455* (2006.01)
*C23C 16/40* (2006.01)
*G02B 5/08* (2006.01)

(52) U.S. Cl.
CPC ...... *C23C 16/45555* (2013.01); *C23C 16/402* (2013.01); *C23C 16/403* (2013.01);
(Continued)

(58) Field of Classification Search
CPC ........ C23C 16/45553; C23C 16/45527; C23C 16/405; C23C 16/403; C23C 16/402; C23C 16/45555
See application file for complete search history.

(56) References Cited

U.S. PATENT DOCUMENTS 3,247,392 A 4/1966 Thelen
3,650,790 A 3/1972 Klenke et al.
(Continued)

FOREIGN PATENT DOCUMENTS

AU 4898500 A 2/2001
AU 2005202375 A1 6/2005
(Continued)

OTHER PUBLICATIONS

Ritala et al. (Handbook of Thin Film Materials, vol. 1, Chapter 2, Atomic Layer Deposition) (Year: 2002).*
(Continued)

*Primary Examiner* — Kelly M Gambetta
(74) *Attorney, Agent, or Firm* — DINSMORE & SHOHL LLP

(57) ABSTRACT

A method of forming a multilayer structure that reflects an omnidirectional structural color by atomic layer deposition (ALD) includes introducing at least one reflective core particle into a reaction chamber and depositing a conformal dielectric layer encapsulating the at least one reflective core particle in a dielectric-layer ALD cycle. Subsequently, a conformal barrier layer encapsulating the conformal dielectric layer is deposited in a barrier-layer ALD cycle, and a conformal absorber layer encapsulating the conformal barrier layer is deposited in an absorber-layer ALD cycle.

21 Claims, 14 Drawing Sheets

(52) U.S. Cl.
CPC ...... *C23C 16/405* (2013.01); *C23C 16/45527* (2013.01); *C23C 16/45553* (2013.01); *G02B 5/085* (2013.01)

(56) References Cited

U.S. PATENT DOCUMENTS

| | | | |
|---|---|---|---|
| 3,769,515 | A | 10/1973 | Clark, Jr. |
| 3,885,408 | A | 5/1975 | Clark, Jr. |
| 3,910,681 | A | 10/1975 | Elliott et al. |
| 3,953,643 | A | 4/1976 | Cheung et al. |
| 4,079,605 | A | 3/1978 | Bartels |
| 4,449,126 | A | 5/1984 | Pekker |
| 4,525,028 | A | 6/1985 | Dorschner |
| 4,544,415 | A | 10/1985 | Franz et al. |
| 4,556,599 | A | 12/1985 | Sato et al. |
| 4,613,622 | A | 9/1986 | Moeller et al. |
| 4,643,518 | A | 2/1987 | Taniguchi |
| 4,673,914 | A | 6/1987 | Lee |
| 4,705,839 | A | 11/1987 | Martin |
| 4,714,308 | A | 12/1987 | Sawamura et al. |
| 4,753,829 | A | 6/1988 | Panush |
| 4,756,602 | A | 7/1988 | Southwell et al. |
| 4,868,559 | A | 9/1989 | Pinnow |
| 4,896,928 | A | 1/1990 | Perilloux et al. |
| 4,930,866 | A | 6/1990 | Berning et al. |
| 4,996,105 | A | 2/1991 | Oyama et al. |
| 5,007,710 | A | 4/1991 | Nakajima et al. |
| 5,043,593 | A | 8/1991 | Tsutsumi et al. |
| RE33,729 | E | 10/1991 | Perilloux |
| 5,132,661 | A | 7/1992 | Pinnow |
| 5,138,468 | A | 8/1992 | Barbanell |
| 5,183,700 | A | 2/1993 | Austin |
| 5,214,530 | A | 5/1993 | Coombs et al. |
| 5,245,329 | A | 9/1993 | Gokcebay |
| 5,279,657 | A | 1/1994 | Phillips et al. |
| 5,283,431 | A | 2/1994 | Rhine |
| 5,323,416 | A | 6/1994 | Bhat et al. |
| 5,410,431 | A | 4/1995 | Southwell |
| 5,423,912 | A | 6/1995 | Sullivan et al. |
| 5,424,119 | A | 6/1995 | Phillips et al. |
| 5,437,931 | A | 8/1995 | Tsai et al. |
| 5,472,798 | A | 12/1995 | Kumazawa et al. |
| 5,491,470 | A | 2/1996 | Veligdan |
| 5,522,923 | A | 6/1996 | Kimura et al. |
| 5,543,665 | A | 8/1996 | Demarco |
| 5,561,420 | A | 10/1996 | Kleefeldt et al. |
| 5,569,332 | A | 10/1996 | Glatfelter et al. |
| 5,569,353 | A | 10/1996 | Zodrow |
| 5,569,535 | A | 10/1996 | Phillips et al. |
| 5,570,847 | A | 11/1996 | Phillips et al. |
| 5,571,624 | A | 11/1996 | Phillips et al. |
| 5,624,486 | A | 4/1997 | Schmid et al. |
| 5,653,792 | A | 8/1997 | Phillips et al. |
| 5,691,844 | A | 11/1997 | Oguchi et al. |
| 5,700,550 | A | 12/1997 | Uyama et al. |
| 5,759,255 | A | 6/1998 | Venturini et al. |
| 5,768,026 | A | 6/1998 | Kiyomoto et al. |
| 5,850,309 | A | 12/1998 | Shirai et al. |
| 5,889,603 | A | 3/1999 | Roddy et al. |
| 5,982,078 | A | 11/1999 | Krisl et al. |
| 6,049,419 | A | 4/2000 | Wheatley et al. |
| 6,055,079 | A | 4/2000 | Hagans et al. |
| 6,130,780 | A | 10/2000 | Joannopoulos et al. |
| 6,150,022 | A | 11/2000 | Coulter et al. |
| 6,156,115 | A | 12/2000 | Pfaff et al. |
| 6,157,480 | A | 12/2000 | Anderson et al. |
| 6,157,489 | A | 12/2000 | Bradley, Jr. et al. |
| 6,157,498 | A | 12/2000 | Takahashi |
| 6,164,777 | A | 12/2000 | Li et al. |
| 6,180,025 | B1 | 1/2001 | Schoenfeld et al. |
| 6,215,592 | B1 | 4/2001 | Pelekhaty |
| 6,242,056 | B1 | 6/2001 | Spencer et al. |
| 6,243,204 | B1 | 6/2001 | Bradley, Jr. et al. |
| 6,246,523 | B1 | 6/2001 | Bradley, Jr. et al. |
| 6,249,378 | B1 | 6/2001 | Shimamura et al. |
| 6,310,905 | B1 | 10/2001 | Shirai |
| 6,331,914 | B1 | 12/2001 | Wood, II et al. |
| 6,383,638 | B1 | 5/2002 | Coulter et al. |
| 6,387,457 | B1 | 5/2002 | Jiang et al. |
| 6,387,498 | B1 | 5/2002 | Coulter et al. |
| 6,399,228 | B1 | 6/2002 | Simpson |
| 6,433,931 | B1 | 8/2002 | Fink et al. |
| 6,451,414 | B1 | 9/2002 | Wheatley et al. |
| 6,475,273 | B1 | 11/2002 | Zimmermann et al. |
| 6,534,903 | B1 | 3/2003 | Spiro et al. |
| 6,565,770 | B1 | 5/2003 | Mayer et al. |
| 6,569,527 | B1 | 5/2003 | Calhoun et al. |
| 6,574,383 | B1 | 6/2003 | Erchak et al. |
| 6,582,764 | B2 | 6/2003 | Fuller et al. |
| 6,596,070 | B1 | 7/2003 | Schmidt et al. |
| 6,618,149 | B1 | 9/2003 | Stirton |
| 6,624,945 | B2 | 9/2003 | Fan et al. |
| 6,667,095 | B2 | 12/2003 | Wheatley et al. |
| 6,686,042 | B1 | 2/2004 | LeGallee |
| 6,699,313 | B2 | 3/2004 | Coulter et al. |
| 6,753,952 | B1 | 6/2004 | Lawrence et al. |
| 6,841,238 | B2 | 1/2005 | Argoitia et al. |
| 6,844,976 | B1 | 1/2005 | Firon et al. |
| 6,873,393 | B2 | 3/2005 | Ma |
| 6,887,526 | B1 | 5/2005 | Arlt et al. |
| 6,894,838 | B2 | 5/2005 | Mizrahi et al. |
| 6,903,873 | B1 | 6/2005 | Joannopoulos et al. |
| 6,913,793 | B2 | 7/2005 | Jiang et al. |
| 6,927,900 | B2 | 8/2005 | Liu et al. |
| 6,997,981 | B1 | 2/2006 | Coombs et al. |
| 7,049,003 | B2 | 5/2006 | Thomsen et al. |
| 7,052,762 | B2 | 5/2006 | Hebrink et al. |
| 7,064,897 | B2 | 6/2006 | Hebrink et al. |
| 7,098,257 | B2 | 8/2006 | Rink et al. |
| 7,106,516 | B2 | 9/2006 | Lotz et al. |
| 7,123,416 | B1 | 10/2006 | Erdogan et al. |
| 7,141,297 | B2 | 11/2006 | Condo et al. |
| 7,169,472 | B2 | 1/2007 | Raksha et al. |
| 7,184,133 | B2 | 2/2007 | Coombs et al. |
| 7,190,524 | B2 | 3/2007 | Grawert et al. |
| 7,215,473 | B2 | 5/2007 | Fleming |
| 7,236,296 | B2 | 6/2007 | Liu et al. |
| 7,267,386 | B2 | 9/2007 | Hesch |
| 7,326,967 | B2 | 2/2008 | Hsieh et al. |
| 7,329,967 | B2 | 2/2008 | Nozawa et al. |
| 7,352,118 | B2 | 4/2008 | Chowdhury et al. |
| 7,367,691 | B2 | 5/2008 | Lin |
| 7,410,685 | B2 | 8/2008 | Rosenberger et al. |
| 7,413,599 | B2 | 8/2008 | Henglein et al. |
| 7,446,142 | B2 | 11/2008 | Meisenburg et al. |
| 7,452,597 | B2 | 11/2008 | Bujard |
| 7,483,212 | B2 | 1/2009 | Cho et al. |
| 7,638,184 | B2 | 12/2009 | Yaoita et al. |
| 7,667,895 | B2 | 2/2010 | Argoitia et al. |
| 7,699,350 | B2 | 4/2010 | Heim |
| 7,699,927 | B2 | 4/2010 | Henglein et al. |
| 7,745,312 | B2 | 6/2010 | Herner et al. |
| 7,847,342 | B2 | 12/2010 | Fukuzumi et al. |
| 7,851,580 | B2 | 12/2010 | Li et al. |
| 7,859,754 | B2 | 12/2010 | Falicoff |
| 7,863,672 | B2 | 1/2011 | Jin et al. |
| 7,903,339 | B2 | 3/2011 | Banerjee et al. |
| 7,929,730 | B2 | 4/2011 | Huang et al. |
| 7,980,711 | B2 | 7/2011 | Takayanagi et al. |
| 8,013,383 | B2 | 9/2011 | Kidoh et al. |
| 8,257,784 | B2 | 9/2012 | Grayson et al. |
| 8,313,798 | B2 | 11/2012 | Nogueira et al. |
| 8,323,391 | B2 | 12/2012 | Banerjee et al. |
| 8,329,247 | B2 | 12/2012 | Banerjee et al. |
| 8,350,314 | B2 | 1/2013 | Fukuzumi et al. |
| 8,440,014 | B2 | 5/2013 | Kitamura et al. |
| 8,446,666 | B2 | 5/2013 | Kurt et al. |
| 8,542,441 | B2 | 9/2013 | Ouderkirk et al. |
| 8,593,728 | B2 | 11/2013 | Banerjee et al. |
| 8,599,464 | B2 | 12/2013 | Park |
| 8,619,365 | B2 | 12/2013 | Harris et al. |
| 8,736,959 | B2 | 5/2014 | Grayson et al. |
| 9,063,291 | B2 | 6/2015 | Banerjee et al. |
| 10,072,335 | B2 | 9/2018 | Marquardt et al. |

(56) References Cited

U.S. PATENT DOCUMENTS

| | | | |
|---|---|---|---|
| 11,009,630 | B2 | 5/2021 | Wu et al. |
| 11,086,053 | B2 | 8/2021 | Banerjee et al. |
| 2001/0022151 | A1 | 9/2001 | Sliwinski et al. |
| 2002/0030882 | A1 | 3/2002 | Vitt et al. |
| 2002/0096087 | A1 | 7/2002 | Glausch |
| 2002/0117080 | A1 | 8/2002 | Okutsu et al. |
| 2002/0129739 | A1 | 9/2002 | Yanagimoto et al. |
| 2003/0002157 | A1 | 1/2003 | Someno |
| 2003/0059549 | A1 | 3/2003 | Morrow et al. |
| 2003/0190473 | A1 | 10/2003 | Argoitia et al. |
| 2004/0047055 | A1 | 3/2004 | Mizrahi et al. |
| 2004/0156984 | A1 | 8/2004 | Vitt et al. |
| 2004/0179267 | A1 | 9/2004 | Moon et al. |
| 2004/0191540 | A1 | 9/2004 | Jakobi et al. |
| 2004/0246477 | A1 | 12/2004 | Moon et al. |
| 2004/0252509 | A1 | 12/2004 | Lin |
| 2004/0263983 | A1 | 12/2004 | Acree |
| 2004/0265477 | A1 | 12/2004 | Nabatova-Gabain et al. |
| 2005/0126441 | A1 | 6/2005 | Skelhorn |
| 2005/0127840 | A1 | 6/2005 | Chowdhury et al. |
| 2005/0132929 | A1 | 6/2005 | Raksha et al. |
| 2005/0152417 | A1 | 7/2005 | Lin |
| 2005/0235714 | A1 | 10/2005 | Lindstrom |
| 2005/0264874 | A1 | 12/2005 | Lin |
| 2006/0006402 | A1 | 1/2006 | Hsieh et al. |
| 2006/0023327 | A1 | 2/2006 | Coombs et al. |
| 2006/0030656 | A1 | 2/2006 | Tarng et al. |
| 2006/0081858 | A1 | 4/2006 | Lin et al. |
| 2006/0145172 | A1 | 7/2006 | Su et al. |
| 2006/0155007 | A1 | 7/2006 | Huber |
| 2006/0159922 | A1 | 7/2006 | O'Keefe |
| 2006/0222592 | A1 | 10/2006 | Burda |
| 2007/0097509 | A1 | 5/2007 | Nevitt et al. |
| 2007/0221097 | A1 | 9/2007 | Tarng et al. |
| 2009/0046368 | A1 | 2/2009 | Banerjee et al. |
| 2009/0082659 | A1 | 3/2009 | Ham et al. |
| 2009/0153953 | A1 | 6/2009 | Banerjee et al. |
| 2009/0161220 | A1 | 6/2009 | Banerjee et al. |
| 2009/0196319 | A1 | 8/2009 | Hori et al. |
| 2009/0241802 | A1 | 10/2009 | Nemoto et al. |
| 2009/0303044 | A1 | 12/2009 | Furuichi et al. |
| 2009/0318614 | A1 | 12/2009 | Chevalier |
| 2009/0321693 | A1 | 12/2009 | Ohkuma et al. |
| 2010/0064938 | A1 | 3/2010 | Voit et al. |
| 2010/0208338 | A1 | 8/2010 | Banerjee et al. |
| 2010/0209593 | A1 | 8/2010 | Banerjee et al. |
| 2010/0213485 | A1 | 8/2010 | McKenzie et al. |
| 2011/0014366 | A1 | 1/2011 | Nogueira et al. |
| 2011/0091658 | A1 | 4/2011 | Banerjee et al. |
| 2011/0113984 | A1 | 5/2011 | Fuller, Jr. et al. |
| 2011/0128616 | A1 | 6/2011 | Banerjee et al. |
| 2011/0134515 | A1 | 6/2011 | Banerjee et al. |
| 2011/0214733 | A1 | 9/2011 | den Boer et al. |
| 2011/0228399 | A1 | 9/2011 | Ohnishi |
| 2011/0266879 | A1 | 11/2011 | Kim et al. |
| 2011/0267247 | A1 | 11/2011 | Choi et al. |
| 2011/0299154 | A1 | 12/2011 | Grayson et al. |
| 2012/0015056 | A1 | 1/2012 | Lee |
| 2012/0050848 | A1 | 3/2012 | Carlson et al. |
| 2012/0107584 | A1 | 5/2012 | Eibon et al. |
| 2012/0153527 | A1 | 6/2012 | Banerjee et al. |
| 2012/0307369 | A1 | 12/2012 | Banerjee et al. |
| 2013/0119298 | A1 | 5/2013 | Raksha et al. |
| 2013/0148221 | A1 | 6/2013 | Banerjee et al. |
| 2013/0213260 | A1 | 8/2013 | Kunii |
| 2013/0250403 | A1 | 9/2013 | Maeda |
| 2013/0265668 | A1 | 10/2013 | Banerjee et al. |
| 2014/0018439 | A1 | 1/2014 | Gruner et al. |
| 2014/0111861 | A1 | 4/2014 | Banerjee et al. |
| 2014/0133045 | A9 | 5/2014 | Banerjee et al. |
| 2014/0211303 | A1 | 7/2014 | Banerjee et al. |
| 2014/0368918 | A1 | 12/2014 | Banerjee et al. |
| 2015/0033988 | A1 | 2/2015 | Wu et al. |
| 2015/0138641 | A1 | 5/2015 | Delst et al. |
| 2015/0138642 | A1 | 5/2015 | Banerjee et al. |
| 2015/0309231 | A1 | 10/2015 | Banerjee |
| 2015/0309232 | A1 | 10/2015 | Banerjee |
| 2017/0212280 | A1 | 7/2017 | Sahlholm et al. |
| 2020/0003939 | A1 | 1/2020 | Banerjee et al. |
| 2020/0103560 | A1* | 4/2020 | Wu .......................... G02B 1/14 |

FOREIGN PATENT DOCUMENTS

| | | | |
|---|---|---|---|
| CA | 2550190 | A1 | 12/2006 |
| CN | 1132773 | A | 10/1996 |
| CN | 1217734 | A | 5/1999 |
| CN | 1313953 | A | 9/2001 |
| CN | 1425046 | A | 6/2003 |
| CN | 1471562 | A | 1/2004 |
| CN | 1527100 | A | 9/2004 |
| CN | 1202429 | C | 5/2005 |
| CN | 1622981 | A | 6/2005 |
| CN | 1637078 | A | 7/2005 |
| CN | 1741246 | A | 3/2006 |
| CN | 1823023 | A | 8/2006 |
| CN | 1930599 | A | 3/2007 |
| CN | 101027365 | A | 8/2007 |
| CN | 101059573 | A | 10/2007 |
| CN | 101105547 | A | 1/2008 |
| CN | 101288007 | A | 10/2008 |
| CN | 101396884 | A | 4/2009 |
| CN | 101619176 | A | 1/2010 |
| CN | 101765791 | A | 6/2010 |
| CN | 101883826 | A | 11/2010 |
| CN | 102132214 | A | 7/2011 |
| CN | 102627874 | A | 8/2012 |
| CN | 102741358 | A | 10/2012 |
| CN | 102803174 | A | 11/2012 |
| CN | 103502333 | A | 1/2014 |
| CN | 103507322 | A | 1/2014 |
| CN | 103513316 | A | 1/2014 |
| CN | 103874939 | A | 6/2014 |
| CN | 203849448 | U | 9/2014 |
| CN | 104380150 | A | 2/2015 |
| CN | 104619668 | A | 5/2015 |
| CN | 104730737 | A | 6/2015 |
| CN | 103402117 | B | 8/2015 |
| DE | 2106613 | A1 | 8/1971 |
| DE | 19823732 | A1 | 12/1999 |
| DE | 102014119261 | A1 | 6/2015 |
| EP | 141143 | B1 | 5/1985 |
| EP | 0927371 | B1 | 7/1999 |
| EP | 1937781 | B1 | 12/2009 |
| EP | 1499568 | B1 | 12/2012 |
| EP | 2910985 | A1 | 8/2015 |
| JP | H0246366 | A | 2/1990 |
| JP | H0312605 | A | 1/1991 |
| JP | H05241017 | A | 9/1993 |
| JP | H06016965 | A | 1/1994 |
| JP | H06118229 | A | 4/1994 |
| JP | 07034324 | | 2/1995 |
| JP | H7-268241 | A | 10/1995 |
| JP | H07258579 | A | 10/1995 |
| JP | H8-259840 | A | 10/1996 |
| JP | H10202813 | A | 8/1998 |
| JP | H1112489 | A | 1/1999 |
| JP | H11101913 | A | 4/1999 |
| JP | H11504953 | A | 5/1999 |
| JP | 2000220331 | A | 8/2000 |
| JP | 2000329933 | A | 11/2000 |
| JP | 2002080749 | A | 3/2002 |
| JP | 2002090522 | A | 3/2002 |
| JP | 2003050311 | A | 2/2003 |
| JP | 2003053875 | A | 2/2003 |
| JP | 2003329824 | A | 11/2003 |
| JP | 2004505158 | A | 2/2004 |
| JP | 2004134743 | A | 4/2004 |
| JP | 2004510013 | A | 4/2004 |
| JP | 2004512394 | A | 4/2004 |
| JP | 2004233500 | A | 8/2004 |
| JP | 2005513207 | A | 5/2005 |
| JP | 2005144925 | A | 6/2005 |
| JP | 2006506518 | A | 2/2006 |
| JP | 2006097426 | A | 4/2006 |

(56) References Cited

FOREIGN PATENT DOCUMENTS

| | | | |
|---|---|---|---|
| JP | 3799696 | B2 | 7/2006 |
| JP | 2006193738 | A | 7/2006 |
| JP | 2006285196 | A | 10/2006 |
| JP | 2007065232 | A | 3/2007 |
| JP | 2007510022 | A | 4/2007 |
| JP | 2007133325 | A | 5/2007 |
| JP | 2007183525 | A | 7/2007 |
| JP | 2008038382 | A | 2/2008 |
| JP | 2008508404 | A | 3/2008 |
| JP | 2008510866 | A | 4/2008 |
| JP | 2008526002 | A | 7/2008 |
| JP | 2008191592 | A | 8/2008 |
| JP | 2008209520 | A | 9/2008 |
| JP | 2008230218 | A | 10/2008 |
| JP | 2008257777 | A | 10/2008 |
| JP | 2009042763 | A | 2/2009 |
| JP | 2009511725 | A | 3/2009 |
| JP | 2010502433 | A | 1/2010 |
| JP | 2010526015 | A | 7/2010 |
| JP | 2010191431 | A | 9/2010 |
| JP | 4948706 | B2 | 6/2012 |
| JP | 2013518946 | A | 5/2013 |
| JP | 2014237819 | A | 12/2014 |
| JP | 2015120350 | A | 7/2015 |
| JP | 2016027095 | A | 2/2016 |
| JP | 2016049777 | A | 4/2016 |
| TW | 200417759 | A | 9/2004 |
| TW | 201013236 | A | 4/2010 |
| WO | 9936258 | A1 | 1/1999 |
| WO | 99/42892 | A1 | 8/1999 |
| WO | 0012634 | A1 | 3/2000 |
| WO | 2000/022466 | A1 | 4/2000 |
| WO | 0031571 | A1 | 6/2000 |
| WO | 02054030 | A2 | 7/2002 |
| WO | 03062871 | A1 | 7/2003 |
| WO | 2003062871 | A1 | 7/2003 |
| WO | 2015153043 | A1 | 10/2015 |
| WO | 2024052846 | A1 | 3/2024 |
| WO | 2024052849 | A1 | 3/2024 |

OTHER PUBLICATIONS

Raja et al. BET Surface Area Analysis of Nanoparticles, Physical Methods in Chemistry and Nanoscience (Barron), Section 2.3, acc Aug. 5, 2025 https://chem.libretexts.org/Bookshelves/Analytical_Chemistry/Physical_Methods_in_Chemistry_and_Nano_Science_(Barron). (Year: 2022).*
Schmid, Raimund and Mronga, Norbert, "A New Generation of Sparkling Effect Pigments", Paint & Coatings Industry; Oct. 2004, vol. 20 Issue 10, p. 118-121.
Sajeev John et al., "Photonic Band Gap Materials: A Semiconductor for Light", Department of Physics, University of Toronto, p. 1-23; 2001.
Distributed Bragg Reflector; en.wikipedia.org/wiki/Bragg_reflector (2005).
Photonic Crystal; en.wikipedia.org/wiki/Photonic_crystals (2003).
Tikhonravov, et al., "Application Of The Needle Optimization Technique To The Design Of Optical Coatings", Applied Optics, Optical Society of America, 1996, pp. 5493-5508, vol. 35, No. 28.
Tikhonravov, Alexander V. et al., "Optical Coating Design Algorithm Based on the Equivalent Layers Theory", Applied Optics: vol. 45, No. 7; Mar. 2006; pp. 1530-1538.
Kaminska, Kate et al., "Birefringent Omnidirectional Reflector", Applied Optics, vol. 43, No. 7, Mar. 2004, pp. 1570-1576.
Deopura, M. "Dielectric Omnidirectional Visible Reflector," Optics Letters, Aug. 1, 2001, vol. 16, No. 15.
Bing-Xin Wei et al., "Detrimental Thixotropic Thinning of Filter Cake of SiO2—Al2O3 Composite Coaled TiO2 Particles and Its Control", Industrial & Engineering Chemistry Research, Sep. 27, 2011, 50, pp. 13799-13804.
Hongqiang et al., "Disordered dielectric high reflectors with broadband from visible to infrared," Applied Physics Letters, American Institute of Physics, Melville, NY, US, vol. 74, No. 22, dated May 31, 2009.
Xifre-Perez et al., "Porous silicon mirrors with enlarged omnidirectional band gap," Journal of Applied Physics, American Institute of Physics, Melville, NY, US, vol. 97, No. 6, dated Mar. 9, 2005.
"Laser 2000 Gmbttp:/ /www. laser2000. de/fileadm in/Produkdaten/SK _ WEB/Datenblaetter _ S Em/S Em ROCK-Stopline- Notchfilter. pdf, accessed Feb. 2, 2010".
Bendiganavale A.K., Malshe, V.C., "Infrared Reflective Inorganic Pigments", Recent Patents On Chemical Engineering, 2008, 1, 67-79.
D.P. Young, Jr., et al. "Comparison of Avian Responses to UV-Light Reflective Paint on Wind Turbines," National Renewable Energy Laboratory, Subcontract Report, Jan. 2003.
Maier, E.J. "To Deal With the Invisible : On the biological significance of ultraviolet sensitivity in birds." Naturwissenschaften 80: 476-478, 1993.
Nixon, J., "Twinkle, Twinkle Little Star," Asia Pacific Coating Journal, Feb. 2004.
Fink, Joel "A Dielectric Omnidirectional Reflector", E.L. Thomas, Science, vol. 282, (Nov. 27, 1988).
Lin, Wei Hua, "Design and Fabrication of Omnidirectional Reflectors in the Visible Range" Journal of Modern Optics, vol. 52, No. 8, 1155 (2005).
Chen, Kevin M. "Si02/Ti02 Omnidirectional Reflector and Microcavity Resonator Via the Sol-Gel Method", Appl. Phys. Lett., vol. 75, No. 24, Dec. 13, 1999.
Almedia, R.M., "Photonic Bandgap Materials and Structures by Sol-Gel Processing", Journal of Non-Crystalline Solids, 405-499 (2003).
Decourby, R.G., "Planar Omnidirectional Reflectors in Chalcogenide Glass and Polymer" Optics Express, 6228, Aug. 8, 2005.
Clement, T.J., "Improved Omnidirectional Reflectors in Chalcogenide Glass and Polymer by Using the Silver Doping Tachnique", Optics Express, 14, 1789 (2006).
Bryant, A., "All-Silicon Omnidirectional Mirrors Based on One-Dimensional Crystals", Appl. Phys. Lett. vol. 82, No. 19, May 12, 2003.
Chigrin, D.N., "Observation of Total Omnidirectional Reflection From a One-Dimensional Dielectric Lattice", Appl. Phys. A. 68, 25-28 (1999).
Park, Y., "GaAs-based Near-infrared Omnidirectional Reflector", Appl. Phys. Lett., vol. 82, No. 17, Apr. 28, 2003.
H-Y Lee, "Design and Evaluation of Omnidirectional One-Dimensional Photonic Crystals", Journal of Appl. Phys. vol. 93, No. 2, Jan. 15, 2003.
Banerjee, Debasish, "Narrow-band Omnidirectional Structural Color", SAE World Congress 01-1049 (2008).
M. Deopura et al., Dielectric Omnidirectional Visible Reflector; Optical Society of America; vol. 26, No. 15; Department of Material Science and Engineering, Massachusetts Institute of Technology; pp. 1197-1199.
Chinese office action for application 202010092655.1 mail date Jun. 3, 2021 (107 pages with English translation).
Chinese office action for application 202010092655.1 mail date Nov. 22, 2021 (10 pages with English translation).
Chinese office action for application 202010215691.2 mail date Jul. 16, 2021 (23 pages with English translation).
Chinese office action for application 202010215691.2 mail date Dec. 13, 2021 (13 pages with English translation).
Chinese office action for application 202010402572.8 mail date Jul. 21, 2021 (13 pages with English translation).
Chinese office action for application 202010402572.8 mail date Dec. 30, 2021 (16 pages with English translation).
Chinese office action for application 202010927458.7 mail date Sep. 15, 2021 (10 pages with English translation).
Chinese office action for application 202010927458.7 mail date Jan. 19, 2022 (13 pages with English translation).
Optical Thin Film Technology, Lu Jinjun, Liu Weiguo, Northwestern Polytechnical University Press, pp. 181-187, Oct. 2015.

(56) References Cited

OTHER PUBLICATIONS

Varieties and Application of Organic Pigments, Shen Yongjia, Chemical Industry Press, pp. 486-490, Jul., 2001.
Handbook of Inorganic Fine Chemicals, Le Zhiqiang, Tianjin Chemical Industry Research and Design Institute, Chemical Industry Press, pp. 1209-1212, Jan. 2001.
Japanese office action for application 2020-105083 mail date Sep. 7, 2021 (14 pages with English Translation).
Japanese office action for application 2020-105083 mail date May 10, 2022 (5 pages with English Translation).
Chinese office action for application 202010173026.1 mail date Oct. 8, 2022 (6 pages with English Translation).
Japanese office action for application 2022-059572 mail date Feb. 16, 2023 (10 pages with English Translation).
German office action for application 10 2015 112 412.2 mail date Mar. 13, 2023 (13 pages with English Translation).
Zhao, Y. [et al.]: Nanostructured Nb2O5 catalysts. In: Nano Reviews, vol. 3, 2012, No. 17631. ISSN 2000-5121.
Office Action dated Sep. 5, 2018 pertaining to Japanese Patent Application No. 2014-117702.
Office Action dated Jun. 4, 2019 pertaining to Japanese Patent Application No. 2014-117702.
Office Action dated Sep. 30, 2018 pertaining to Chinese Patent Application No. 201410693385.4.
Office Action dated Apr. 22, 2019 pertaining to Chinese Patent Application No. 201410693385.4.
Office Action dated Sep. 21, 2018 pertaining to German Patent Application No. 10 2014 119 261.3.
Office Action dated Feb. 5, 2019 pertaining to Japanese Patent Application No. 2016-559529.
Office Action dated Jul. 12, 2018 pertaining to Chinese Patent Application No. 201580026216.8.
Office Action dated Apr. 1, 2019 pertaining to Chinese Patent Application No. 201580026216.8.
Office Action dated Oct. 9, 2019 pertaining to Chinese Patent Application No. 201580026216.8.
International Preliminary Report on Patentability dated Oct. 4, 2016 pertaining to PCT/US2015/018640, filed Mar. 4, 2015.
International Search Report and Written Opinion dated May 29, 2015 pertaining to PCT/US2015/018640, filed Mar. 4, 2015.
Office Action dated Nov. 2, 2018 pertaining to Chinese Patent Application No. 201510498432.4.
Office Action dated Jun. 28, 2019 pertaining to Chinese Patent Application No. 201510498432.4.
Office Action dated Dec. 3, 2019 pertaining to Chinese Patent Application No. 201510498432.4.
Office Action dated May 28, 2019 pertaining to Japanese Patent Application No. 2015-160731.
Office Action dated Mar. 20, 2018 pertaining to Japanese Patent Application No. 2015-169044.
Office Action dated Feb. 8, 2018 pertaining to German Patent Application No. 102015113535.3.
Office Action dated Sep. 4, 2018 pertaining to Chinese Patent Application No. 201510624641.9.
Office Action dated Nov. 5, 2019 pertaining to Japanese Patent Application No. 2016-014076.
Office Action dated Jul. 16, 2019 pertaining to Chinese Patent Application No. 201610040211.7.
Office Action dated Oct. 29, 2018 pertaining to Chinese Patent Application No. 201610397388.2.
Office Action dated Jun. 4, 2019 pertaining to Chinese Patent Application No. 201610397388.2.
Office Action dated May 29, 2018 pertaining to Japanese Patent Application No. 2016-113282.
Office Action dated Apr. 16, 2019 pertaining to Japanese Patent Application No. 2016-113282.
Office Action dated Oct. 29, 2018 pertaining to Chinese Patent Application No. 201610397718.8.
Office Action dated Jun. 5, 2018 pertaining to Japanese Patent Application No. 2016-113434.
Office Action dated Oct. 25, 2018 pertaining to Chinese Patent Application No. 201610395759.3.
Office Action dated Jun. 4, 2019 pertaining to Chinese Patent Application No. 201610395759.3.
Office Action dated May 29, 2018 pertaining to Japanese Patent Application No. 2016-113285.
Office Action dated Apr. 16, 2019 pertaining to Japanese Patent Application No. 2016-113285.
Office Action dated Jul. 10, 2019 pertaining to Chinese Patent Application No. 201710284783.4.
Office Action dated Sep. 18, 2018 pertaining to Japanese Patent Application No. 2017-085886.
Office Action dated Jun. 4, 2019 pertaining to Japanese Patent Application No. 2017-085886.
Office Action dated Jan. 23, 2013 pertaining to Japanese Patent Application No. 2008-208255.
Office Action dated Feb. 26, 2014 pertaining to Japanese Patent Application No. 2008-208255.
Office Action dated Sep. 30, 2014 pertaining to Japanese Patent Application No. 2008-208255.
Office Action dated Jan. 30, 2017 pertaining to Japanese Patent Application No. 2010-114777.
Office Action dated Jan. 29, 2015 pertaining to Japanese Patent Application No. 2011-126545.
Office Action dated Jun. 23, 2015 pertaining to Japanese Patent Application No. 2011-126545.
Office Action dated Jan. 27, 2014 pertaining to Japanese Patent Application No. 2011-213056.
Office Action dated Nov. 20, 2014 pertaining to Japanese Patent Application No. 2011-213056.
Office Action dated Aug. 15, 2017 pertaining to Japanese Patent Application No. 2013-167895.
Office Action dated Feb. 20, 2018 pertaining to Japanese Patent Application No. 2013-167895.
English Translation of German office action for application 10 2016 110 192.3 mail date Jan. 11, 2021 (12 pages).
English Translation of German office action for application 10 2016 110 314.4 mail date Jan. 11, 2021 (13 pages).
English Translation of German office action for application 10 2016 110 095.1 mail date Jan. 11, 2021 (13 pages).
German office action for application 11 2010 001 362.4 mail date May 10, 2021 (12 pages with English translation).
Chinese office action for application 202010927458.7 mail date Apr. 16, 2021 (27 pages with English translation).
German office action for application 10 2017 107 230.6 mail date Feb. 2, 2021 (14 pages with English translation).
Japanese office action for application 2020-002230 mail date Feb. 8, 2021 (5 pages with English translation).
International Search Report and Written Opinion dated Nov. 11, 2024, pertaining to Int'l Patent Application No. PCT/IB2024/000350, 10 pages.

* cited by examiner

ATOMIC LAYER DEPOSITION METHODS FOR MAKING OMNIDIRECTIONAL STRUCTURAL COLOR MULTILAYER STRUCTURES

FIELD OF THE INVENTION

The present disclosure is related to methods for making multilayer structures that reflect an omnidirectional structural color (OSC), and in particular to methods for making multilayer structures comprising metal and metal oxide layers encapsulating at least one reflective core particle, where at least one of the metal and metal-oxide layers are deposited by atomic layer deposition (ALD), and a barrier layer is positioned between each adjacent metal and metal-oxide layer.

BACKGROUND OF THE INVENTION

Preparing OSC multilayer structures can be a complex, expensive process because, in part, very tight control over layer thicknesses and layer quality is required. Small variation in the layer thickness and minute contamination in layer materials (i.e., including the infiltration of materials between adjacent layers) can affect the optical performance of OSC multilayer structures.

However, conventional deposition methods used to form multilayer structures can vary in complexity and cost depending on the desired thickness of the layer and the material that makes up a given layer. Also, conventional deposition methods limit the size and shape of substrates or the direction of deposition leaving the sides and edges of substrates uncoated or unevenly coated. The defects on the sides and at the edges of the substrates can lead to, for example, unwanted scattering or transmission loss.

Forming OSC multilayer structures using ALD methods are known. However, conventional ALD methods are low-volume and therefore are cost-prohibitive to manufacture at a commercial scale.

SUMMARY OF THE INVENTION

A first aspect comprises a method of forming a multilayer structure that reflects an omnidirectional structural color by atomic layer deposition (ALD), the method comprising: introducing at least one reflective core particle into a reaction chamber; depositing a conformal dielectric layer encapsulating the at least one reflective core particle in a dielectric-layer ALD cycle; depositing a conformal barrier layer encapsulating the conformal dielectric layer in a barrier-layer ALD cycle; and depositing a conformal absorber layer encapsulating the conformal barrier layer in an absorber-layer ALD cycle.

A second aspect includes the method of the first aspect, wherein the at least one reflective core particle comprises a conformal protective layer encapsulating the at least one reflective core particle.

A third aspect includes the method of the second aspect, wherein the conformal protective layer is formed by ALD, CVD, or wet chemistry methods.

A fourth aspect includes the method of any of the previous aspects, further comprising depositing a conformal outer protective layer encapsulating the conformal absorber layer in an outer-protective-layer ALD cycle.

A fifth aspect includes the method of any of the previous aspects, further comprising depositing a second conformal barrier layer encapsulating the conformal absorber layer in a second barrier-layer ALD cycle; and depositing a second conformal dielectric layer encapsulating the second conformal barrier layer in a second dielectric-layer ALD cycle.

A sixth aspect includes the method of the fifth aspect, further comprising depositing a conformal outer protective layer encapsulating the second conformal dielectric layer in an outer-protective-layer ALD cycle.

A seventh aspect includes the method of any of the previous aspects, wherein the dielectric-layer ALD cycle comprises, in sequence: supplying a first component selected from the group consisting of halides, alkyl, alkoxides, alkylamides, and carbonyls of Ti, Zn, Zr, Hf, Fe, Al, Pb, Ga, In, Si, Mg, K, and combinations thereof into the reaction chamber; purging the reaction chamber with a purge gas selected from the group consisting of nitrogen, argon, and combinations thereof, supplying a second component selected from the group consisting of $O_2$, $O_3$, $H_2O$, $H_2O_2$, $As_2O_3$, $As_2O_5$, $H_2S$, $S_2$, $Br_2$, HF, $NH_4F$, $SF_6$, and combinations thereof into the reaction chamber; and purging the reaction chamber with a purge gas selected from the group consisting of nitrogen, argon, and combinations thereof.

An eighth aspect includes the method of any of the previous aspects, wherein the barrier-layer ALD cycle comprises, in sequence: supplying a first component is selected from the group consisting of halides, alkyl, alkoxides, alkylamides, and carbonyls of Al, Si, Mg, K, Zn, and combinations thereof into the reaction chamber; purging the reaction chamber purged with a purge gas selected from the group consisting of nitrogen, argon, and combinations thereof, supplying a second component selected from the group consisting of $O_2$, $O_3$, $H_2O$, $H_2O_2$, $Br_2$, HF, $NH_4F$, and combinations thereof into the reaction chamber; and purging the reaction chamber is purged with a purge gas selected from the group consisting of nitrogen, argon, and combinations thereof.

A ninth aspect includes the method of any of the previous aspects, wherein the absorber-layer ALD cycle comprises, in sequence: supplying a first component selected from the group consisting of halides, alkyl, alkoxides, alkylamides, and carbonyls of W, Cr, Ge, Ni, Pd, Ti, Si, V, Co, Mo, Nb, and combinations thereof into the reaction chamber; purging the reaction chamber with a purge gas selected from the group consisting of nitrogen, argon, and combinations thereof, supplying a second component selected from the group consisting of $SiH_4$, $Si_2H_6$, $BH_3$, $B_2H_6$, $H_2$, $N_2$, $NH_3$, $O_2$, $O_3$, $H_2O$, $H_2O_2$, and combinations thereof into the reaction chamber; and purging the reaction chamber with a purge gas selected from the group consisting of nitrogen, argon, and combinations thereof.

A tenth aspect includes the method of the fourth aspect, wherein the outer-protective-layer ALD cycle comprises, in sequence: supplying a first component selected from the group consisting of halides, alkyl, alkoxides, alkylamides, and carbonyls of Al, Si, Mg, K, Zn, and combinations thereof into the reaction chamber; purging the reaction chamber with a purge gas selected from the group consisting of nitrogen, argon, and combinations thereof, supplying a second component selected from the group consisting of $O_2$, $O_3$, $H_2O$, $H_2O_2$, $Br_2$, HF, $NH_4F$, and combinations thereof into the reaction chamber; purging the reaction chamber with a purge gas selected from the group consisting of nitrogen, argon, and combinations thereof, supplying trimethyl aluminum and water into the reaction chamber; and purging the reaction chamber with a purge gas selected from the group consisting of nitrogen, argon, and combinations thereof.

An eleventh aspect includes the method of the fifth aspect, wherein the second barrier-layer ALD cycle comprises, in sequence supplying a first component selected from the group consisting of halides, alkyl, alkoxides, alkylamides, and carbonyls of Al, Si, Mg, K, Zn, and combinations thereof into the reaction chamber; purging the reaction chamber with a purge gas selected from the group consisting of nitrogen, argon, and combinations thereof, supplying a second component selected from the group consisting of $O_2$, $O_3$, $H_2O$, $H_2O_2$, $Br_2$, HF, $NH_4F$, and combinations thereof into the reaction chamber; and purging the reaction chamber with a purge gas selected from the group consisting of nitrogen, argon, and combinations thereof.

A twelfth aspect includes the method of the fifth aspect, wherein the second dielectric-layer ALD cycle comprises, in sequence: supplying a first component selected from the group consisting of halides, alkyl, alkoxides, alkylamides, and carbonyls of Ti, Zn, Zr, Hf, Fe, Al, Pb, Ga, In, Si, Mg, K, and combinations thereof into the reaction chamber; purging the reaction chamber with a purge gas selected from the group consisting of nitrogen, argon, and combinations thereof, supplying a second component selected from the group consisting of $O_2$, $O_3$, $H_2O$, $H_2O_2$, $As_2O_3$, $As_2O_5$, $H_2S$, $S_2$, $Br_2$, HF, $NH_4F$, $SF_6$, and combinations thereof into the reaction chamber; and purging the reaction chamber with a purge gas selected from the group consisting of nitrogen, argon, and combinations thereof.

A thirteenth aspect includes the method of any of the previous aspects, wherein the reaction chamber, in each of the dielectric-layer ALD cycle, the barrier-layer ALD cycle, and the absorber-layer ALD cycle individually, comprises: a pressure that is greater than or equal to 13 pascals and less than or equal to 2666 pascals; and a temperature that is greater than or equal to 60° C. and less than or equal to 150° C.

A fourteenth aspect includes the method of the fifth aspect, wherein the reaction chamber, in each of the second barrier-layer ALD cycle and the second dielectric-layer ALD cycle individually, comprises: a pressure that is greater than or equal to 13 pascals and less than or equal to 2666 pascals; and a temperature that is greater than or equal to 60° C. and less than or equal to 150° C.

A fifteenth aspect includes the method of any of the previous aspects, wherein the at least one reflective core particle is selected from the group consisting of Au, Cu, Al, brass, bronze, TiN, Cr, stainless steel, alumina ($Al_2O_3$), silica ($SiO_2$), bismuth oxychloride, glass materials, mica, and combinations thereof.

A sixteenth aspect includes the method of any of the previous aspects, wherein the conformal dielectric layer is selected from the group consisting of $TiO_2$, ZnS, $ZrO_2$, $HfO_2$, $Fe_3O_4$, AlAs, $Fe_2O_3$, PbS, GaAs, InAs, $SiO_2$, $MgF_2$, KBr, ZnO, $Al_2O_3$, and combinations thereof, the conformal barrier layer is selected from the group consisting of $Al_2O_3$, $SiO_2$, $MgF_2$, KBr, ZnO, and combinations thereof; and the conformal absorber layer is selected from the group consisting of W, Cr, Ge, Ni, stainless steel, Pd, Ti, Si, V, TiN, Co, Mo, Nb, ferric oxide, and combinations thereof.

A seventeenth aspect includes the method of the fourth aspect, wherein the conformal outer protective layer is selected from the group consisting of $SiO_2$, $Al_2O_3$, organosilane, organic phosphine, phosphates, and combinations thereof.

An eighteenth aspect includes the method of the fifth aspect, wherein the second conformal barrier layer is selected from the group consisting of $Al_2O_3$, $SiO_2$, $MgF_2$, KBr, ZnO, and combinations thereof; and the second conformal dielectric layer is selected from the group consisting of $TiO_2$, ZnS, $ZrO_2$, $HfO_2$, $Fe_3O_4$, AlAs, $Fe_2O_3$, PbS, GaAs, InAs, $SiO_2$, $MgF_2$, KBr, ZnO, $Al_2O_3$, and combinations thereof.

A nineteenth aspect includes the method of the sixth aspect, wherein the conformal outer protective layer is selected from the group consisting of $SiO_2$, $Al_2O_3$, organosilane, organic phosphine, phosphates, and combinations thereof.

A twentieth aspect includes the method of any of the previous aspects, wherein the conformal dielectric layer has a thickness that is greater than or equal to 5 nm and less than or equal to 500 nm; the conformal barrier layer has a thickness that is less than or equal to 50 nm; and the conformal absorber layer has a thickness that is greater than or equal to 2 nm and less than or equal to 50 nm.

A twenty-first aspect includes the method of the fifth aspect, wherein the second conformal barrier layer has a thickness that is less than or equal to 50 nm; and the second conformal dielectric layer has a thickness that is greater than or equal to 5 nm and less than or equal to 500 nm.

DETAILED DESCRIPTION

Figure 1:
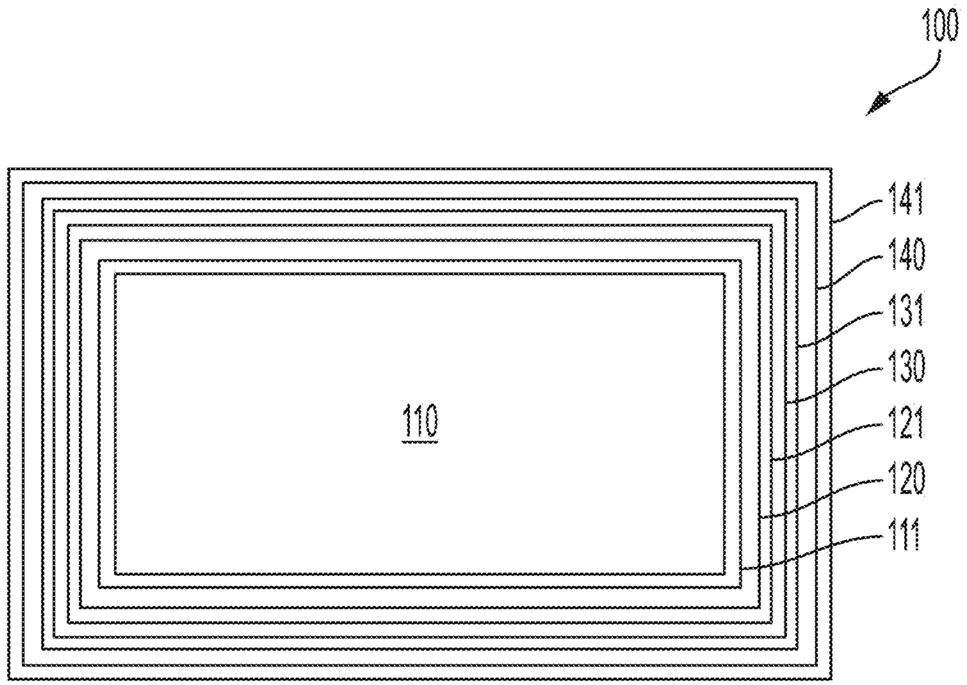
FIG. 1 is a schematic cross section of a multilayer thin film structure according to embodiments disclosed and described herein.

The present disclosure refers to atomic layer deposition (ALD) of multilayer structures containing metal and metal oxide over reflective substrates for optical applications. At least one of the metal and metal oxide are deposited by ALD, and a barrier layer is positioned between each adjacent metal and metal oxide layer.

Forming omnidirectional structural color (OSC) multilayer structures by depositing metals or metal oxides directly to a reflective material and to other metal and/or metal oxide layers using ALD methods is known. However, ALD deposition has heretofore been costly and time consuming. In particular, the ALD methods conventionally used are low-volume and are cost prohibitive to manufacture at a commercial scale. Moreover, when attempts were made to increase the production volume, cross-layer material infiltration was observed. Accordingly, methods of forming OSC multilayer structures that enable conformal coating, ultrathin layer deposition with nanoscale precision, minimal cross-layer material infiltration, and reduced manufacture time are desirable.

For instance, ALD deposits material essentially on an atomic level, so it can take a large amount of time to deposit thick layers using an ALD process, such as layers having a thickness greater than 500 nm. Accordingly, ALD is typically not preferred for depositing every layer in a multilayer structure. Because of the cost and time constraints, ALD has traditionally been reserved for depositing very thin layers.

Moreover, when attempts were made to increase the production volume, it was noticed that various metal and/or metal oxide layers overlapped one another and formed a mixed layer that could have an effect on the optical properties of the OSC multilayer structure. It is believed that this overlap occurs because of the high porosity of the dielectric layer. That is, when a metal absorber layer is deposited by ALD, the high porosity of the dielectric layer allows the metal to be impregnated into the pores of an adjacent dielectric layer overlapping with the dielectric layer and resulting in a layer of mixed metal and metal oxide. This mixed layer can have a marked effect on the overall optical properties of the multilayer structures by reducing the reflection and transmission properties of the dielectric layer.

But, as noted above, preparing OSC multilayer structures requires very tight control over layer thicknesses and layer quality, and small variation in the thickness and material can affect the optical performance of OSC multilayer structures.

ALD is one technique that is good at depositing layers with nanoscale thicknesses directly on a reflective core layer. Further, ALD can deposit layers that conform to the size and shape of the substrate to which it is being deposited such that the deposited layer encapsulates (i.e., is present on all sides) of the substrate. That is, the substrates and the resulting multilayer structures can have an asymmetric and non-uniform shape.

Accordingly, disclosed herein are ALD methods for forming multilayer structures, wherein ALD processes to coat each of the layers of a multilayer structure can be conducted in the same chamber. This means downtime to remove the particles and load them into another chamber can be avoided. The processes disclosed herein allow for safe and effective commercial-level upscaling of the ALD process, which was previously was only conducted on a bench scale with several grams of material being produced.

Further, ALD methods disclosed and described herein can be used to apply thin (nanoscale) metallic and metal oxide layers onto a reflective substrate as well as applying metal and metal oxide layers onto other metal and metal oxide layers. In addition, thin barrier layers may be deposited between adjacent metal and metal oxide layers. The barrier layer prevents the metal to be impregnated into the pores of the dielectric layer and the formation of a mixed layer. With a barrier layer, all the adjacent metal and metal oxide layers are well separated, so do their optical properties are well predicted by simulation. Moreover, in embodiments, the barrier layer is a thin layer and made from a material that does not affect the optical properties of the multilayer structure.

The multilayer structure made by methods disclosed herein can be used as a pigment in compositions (such as, for example, a paint composition), a continuous thin film on a structure, and the like.

Embodiments of the multilayer structure described herein may be used to omnidirectionally reflect wavelengths of visible light over a range of angles of incidence of viewing.

Also, in embodiments, the OSC multilayer structure may reflect a single narrow band of electromagnetic radiation in the visible spectrum when exposed to broadband electromagnetic radiation. The single narrow band of visible light comprises a color shift of the single narrow band of visible light is less than 30° measured in Lab color space when viewed from angles between 0° and 45° relative to a direction normal to an outer surface of the multilayer thin film. Such hue shift is small or non-noticeable. For instances, embodiments of the multilayer structure 100 described above may have a hue shift of less than 30°, such as less than 25°, less than 20°, less than 15°, or less than 100 in the Lab color space when viewed at angles from 0° to 45°.

It will be understood that the terms "electromagnetic wave," "electromagnetic radiation," and "light," as used herein, may interchangeably refer to various wavelengths of light incidence on a multilayer structure and that such light may have wavelengths in the ultraviolet (UV), infrared (IR), and visible portions of the electromagnetic spectrum.

As used herein, a "substrate" refers to a core layer and a core particle. It will be understood that the terms "substrate," "core layer," and "core particle," as used herein, may interchangeably refer to a surface to which the layer materials are deposited. The "substrate" may have any shape including, but not limited to a flake, a sphere, an ovoid, and the like.

As used herein, an "absorber layer' includes a metallic absorber layer and a non-metallic absorber layer.

As used herein, a "dielectric layer" includes a metal-oxide dielectric layer and a non-metal-oxide dielectric layer.

The multilayer structures will now be described. Referring now to FIG. 1, a multilayer structure 100 according to embodiments disclosed and described herein comprises a reflective core particle 110, a conformal protective layer 111 that encapsulates the reflective core particle 110, a conformal dielectric layer 120 that encapsulates the conformal protective layer 111, a conformal barrier layer 121 that encapsulates the conformal dielectric layer 120, a conformal absorber layer 130 that encapsulates the conformal barrier layer 121, a second conformal barrier layer 131 that encapsulates the conformal absorber layer 130, a second conformal dielectric layer 140 that encapsulates the second conformal barrier layer 131, and a conformal outer protective layer 141 that encapsulates the second conformal dielectric layer 140. As used herein, "conformal" is used to indicate that the layer conforms to the size and shape of the layer to which it is deposited and encapsulates (i.e., is present on all sides) of the layer to which it is deposited and conforms to the contours of the layer which it is deposited. Although FIG. 1 shows a rectangular structure, this is for illustrative purposes only, and often the multilayer structure will have an asymmetric and non-uniform shape. In embodiments, the multilayer structure may be spherical or ovoid.

In one or more embodiments, the multilayer structure 100 may comprise less layers than those depicted in FIG. 1. For instance, in embodiments, a multilayer structure 100 comprises a substrate 110, a first conformal protective layer 111 that encapsulates the substrate 110, a conformal dielectric layer 120 that encapsulates the first conformal protective layer 111, a conformal barrier layer 121 that encapsulates the conformal dielectric layer 120, a conformal absorber layer 130 that encapsulates the conformal barrier layer 121, a second conformal barrier layer 131 that encapsulates the conformal absorber layer 130, and a second conformal dielectric layer 140 that encapsulates the second conformal barrier layer 131.

In one or more embodiments, a multilayer structure 100 comprises a substrate 110, a conformal dielectric layer 120 that encapsulates the substrate 110, a conformal barrier layer 121 that encapsulates the conformal dielectric layer 120, a conformal absorber layer 130 that encapsulates the conformal barrier layer 121, a second conformal barrier layer 131 that encapsulates the conformal absorber layer 130, and a second conformal dielectric layer 140 that encapsulates the second conformal barrier layer 131. An optional conformal outer protective layer 141 may encapsulate the second conformal dielectric layer 140.

In embodiments, a multilayer structure 100 comprises a substrate 110, a conformal dielectric layer 120 that encapsulates the substrate 110, a conformal barrier layer 121 that encapsulates the conformal dielectric layer 120, and a conformal absorber layer 130 that encapsulates the conformal barrier layer 121. An optional conformal outer protective layer may encapsulate the conformal absorber layer 130.

In one or more embodiments, a multilayer structure 100 comprises a substrate 110, a first conformal protective layer 111 that encapsulates the substrate 110, a conformal dielectric layer 120 that encapsulates the first conformal protective layer 111, a conformal barrier layer 121 that encapsulates the conformal dielectric layer 120, and a conformal absorber layer 130 that encapsulates the conformal barrier layer 121. A second conformal barrier layer 131 may optionally encapsulate the conformal absorber layer 130.

It should be understood that embodiments may also include a multilayer structure with a conformal absorber layer encapsulating the substrate and a conformal dielectric layer encapsulating the conformal absorber layer. This multilayer structure may further comprise an optional conformal protective layer positioned between the conformal absorber layer and the substrate and an optional barrier, an optional conformal barrier layer positioned between the conformal dielectric layer and the conformal absorber layer, and an optional outer protective layer encapsulating the conformal dielectric layer.

The ALD methods for making multilayer structures disclosed herein will now be generally described. ALD of each layer (dielectric layer, barrier layer, absorber layer, protective layer, and the outer-protective layer) is carried out by coating a substrate with corresponding precursor compounds at proper temperature, usually ranging from 60° C.-150° C., in a stirred reactor. Precursors are supplied in gas phase, which might be gas at ambient temperature or is vaporized and transported by carrier gases such as nitrogen and argon. It will be understood that the terms "precursors," "precursor compounds," and "compounds" as used herein, may interchangeably refer to various precursors supplied to form the dielectric layer, barrier layer, absorber layer, the protective layer, and the outer-protective layer of a multilayer structure.

Figure 2:
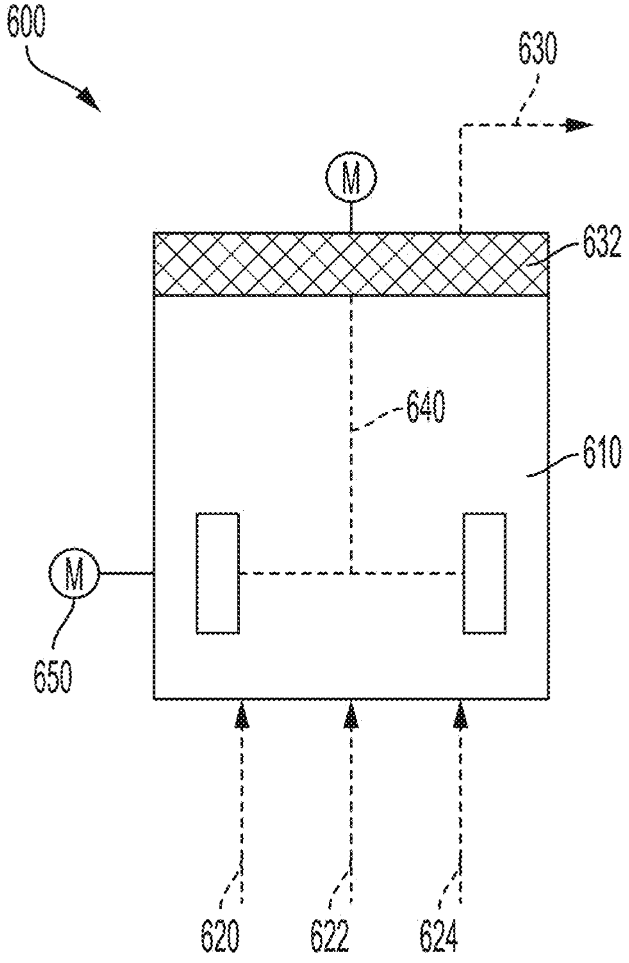
FIG. 2 schematically depicts a stirred reactor for performing an ALD process according to embodiments disclosed and described herein.

With reference now to FIG. 2, a stirred reactor 600 for depositing layers by ALD according to one or more embodiments includes a reaction chamber 610 in which the ALD is conducted. The reaction chamber 610 may be equipped with a heater (not shown). The reaction chamber 610 also comprises an inlet for a first precursor gas 620, an inlet for a second precursor gas 622, and an inlet for a purge gas 624. It should be understood that in embodiments, a single inlet may be present in the chamber 610 for the first precursor gas 620, second precursor gas 622, and purge gas 624, and in other embodiments two or three distinct inlets may be present in the chamber 610 for the first precursor gas 620, second precursor gas 622, and purge gas 624. It should also be understood that additional inlets may be provided if more than two precursors are needed. For the sake of clarity, FIG. 5 depicts an embodiment with three inlets for the first precursor gas 620, second precursor gas 622, and purge gas 624. The chamber 610 may also include a gas outlet 630 for releasing gasses from the chamber 610. According to one or more embodiments, the gas outlet 630 may include a pump (not shown) to facilitate releasing gasses from the chamber 610, and the gas outlet 630 may include a filter 632 that prevents particles from exiting the chamber 610 via the gas outlet 630. A stirring apparatus 640 is also present within the chamber 610 to agitate particles during the ALD process. A chamber vibrator 650 is used to vibrate the chamber 610 during the ALD process, which helps ensure even deposition.

During the ALD process, and with reference still to FIG. 2, multiple layers may be coated to substrates (such as multiple reflective core layers 110) in the stirred reactor 600. The substrates are introduced into the reaction chamber 610 and mixed with stirring apparatus 640. The chamber vibrator 650 may be used to avoid powder aggregation and enhance coating homogeneity, which means a large flow of fluidized gas is not required for this type of stirred reactor. To perform the ALD for each layer (e.g. conformal dielectric layer 120 and conformal metallic absorber layer 130) the previously deposited layer (or the substrate) is coated with a corresponding precursor at a deposition temperature. In embodiments, the deposition temperature may be greater than or equal to 60° C. and less than or equal to 150° C., such as greater than or equal to 80° C. and less than or equal to 150° C., greater than or equal to 90° C. and less than or equal to 150° C., greater than or equal to 100° C. and less than or equal to 150° C., greater than or equal to 110° C. and less than or equal to 150° C., greater than or equal to 120° C. and less than or equal to 150° C., greater than or equal to 130° C. and less than or equal to 150° C., greater than or equal to 60° C. and less than or equal to 130° C., greater than or equal to 80° C. and less than or equal to 130° C., greater than or equal to 90° C. and less than or equal to 130° C., greater than or equal to 100° C. and less than or equal to 130° C., greater than or equal to 110° C. and less than or equal to 130° C., greater than or equal to 120° C. and less than or equal to 130, greater than or equal to 60° C. and less than or equal to 120° C., greater than or equal to 80° C. and less than or equal to 120° C., greater than or equal to 90° C. and less than or equal to 120° C., greater than or equal to 100° C. and less than or equal to 120° C., greater than or equal to 110° C. and less than or equal to 120° C., greater than or equal to 60° C. and less than or equal to 110° C., greater than or equal to 80° C. and less than or equal to 110° C., greater than or equal to 90° C. and less than or equal to 110° C., greater than or equal to 100° C. and less than or equal to 110° C., greater than or equal to 60° C. and less than or equal to 100° C., greater than or equal to 80° C. and less than or equal to 100° C., greater than or equal to 90° C. and less than or equal to 100° C., greater than or equal to 60° C. and less than or equal to 90° C., greater than or equal to 80° C. and less than or equal to 90° C., or greater than or equal to 60° C. and less than or equal to 80° C. The precursor may be supplied in a gas phase or vaporized and transported by a carrier gas, such as nitrogen and argon.

Dielectric layers and barrier layers are deposited, according to embodiments, by reaction between metal-containing compounds and oxygen-containing materials. In embodiments, the metal-containing compounds include halides, alkyls, alkoxides, alkylamides, and carbonyls. For example, to form a conformal dielectric layer of $TiO_2$ onto a substrate, titanium tetrachloride ($TiCl_4$) may be selected as precursor according to embodiments, and to form a conformal barrier layer of $Al_2O_3$, trimethyl aluminum (TMA) may be selected as precursor according to embodiments. In embodiments, the oxygen-containing materials include oxygen ($O_2$), ozone ($O_3$), water ($H_2O$), and hydrogen peroxide ($H_2O_2$). The metal-containing compound and the oxygen-containing compound are supplied in stoichiometric ratio as a first precursor, and the amount of the first precursor is estimated according to surface area of the uncoated particles to improve precursor utilization.

In one or more embodiments, the conformal metal absorber layers are deposited by reaction between metal-containing compounds and one or more reducing agent(s). Metal-containing compounds according to embodiments include halides, alkyls, alkoxides, alkylamides and carbonyls. For example, to deposit a W metallic absorber, tungsten hexafluoride ($WF_6$) is selected as a metal-containing compound. Reducing agents of embodiments include silane ($SiH_4$), disilane ($Si_2H_6$), borane ($BH_3$), diborane ($B_2H_6$), and hydrogen ($H_2$). The metal-containing compound and the reducing agent(s) are supplied in stoichiometric ratio as a second precursor, and the amount of the second precursor is estimated according to surface area of the uncoated particles to improve precursor utilization.

The steps for forming multilayer structures using the stirred reactor 600 shown in FIG. 2 will now be provided.

In a first step, and according to embodiments, substrate particles-such as reflective core layer particles—are introduced into the stirred reactor 600, and the chamber 610 is vacuumed and heated to the deposition temperature, which is in general from 60° C. to 150° C., as disclosed above. This temperature is maintained for 1 hour to 4 hours, such as from 1 hour to 3 hours or from 2 hours to 4 hours to confirm it is stable.

In a second step, and according to embodiments, a first precursor gas 620 is introduced into the reaction chamber 610 through an inlet for a duration of 1 second to 60 seconds. This first precursor gas 620 dosing step is monitored by a pressure sensor. The substrates are mixed with the first precursor gas 620 at target pressure for sufficient absorption of the first precursor gas 620 onto active sites of the substrates.

In a third step, and according to embodiments, the chamber 610 is purged by introducing a purge gas 624 into the chamber 610 through an inlet to remove excess first precursor and by-products present in the chamber 610 after the second step. The purge gas 624 is introduced into the chamber 610 for a duration of 1 second to 60 seconds and then followed by pulling a vacuum in the chamber 610. Purge gas 624 is a dry, inert gas, such as nitrogen, argon, or combinations thereof. This third step can be repeated multiple times to confirm the excess first precursor will not impact following steps.

In a fourth step, and according to embodiments, a second precursor gas 622 is introduced into chamber 610 via an inlet for a duration of 1 second to 60 seconds. The second precursor gas 622 dosing step is monitored by a pressure sensor. The substrates, which are now coated with a conformal dielectric layer, are mixed with the second precursor at target pressure for sufficient reaction between the metal-containing compound and the reducing agent of the second precursor gas 622.

In a fifth step, and according to embodiments, the chamber 610 is again purged by introducing a purge gas 624 into the chamber 610 via an inlet to remove excess precursors and by-products introduced into the chamber 610 by the fourth step. The purge gas 624 is introduced into the chamber 610 for a duration of 1 second to 60 seconds and then followed by pulling a vacuum in the chamber 610. This step can be repeated multiple times to confirm the excess precursors will not impact following steps.

It should be understood that in embodiments, the metallic absorber layer may be deposited directly on the substrate by introducing the second precursor gas in step two, and a dielectric layer may be deposited on the absorber layer by introducing the first precursor in step four.

In the second and fourth steps described above, each individual precursor dosing step is monitored by a pressure sensor. The pressure in the reaction chamber 610 may be greater than or equal to 13 pascals (Pa) and less than or equal to 2666 Pa, such as greater than or equal to 67 Pa and less than or equal to 2666 Pa, greater than or equal to 133 Pa and less than or equal to 2666 Pa, greater than or equal to 667 Pa and less than or equal to 2666 Pa, greater than or equal to 1333 Pa and less than or equal to 2666 Pa, greater than or equal to 2000 Pa and less than or equal to 2666 Pa, greater than or equal to 13 Pa and less than or equal to 2333 Pa, greater than or equal to 67 Pa and less than or equal to 2333 Pa, greater than or equal to 133 Pa and less than or equal to 2333 Pa, greater than or equal to 667 Pa and less than or equal to 2333 Pa, greater than or equal to 1333 Pa and less than or equal to 2333 Pa, greater than or equal to 2000 Pa and less than or equal to 2333 Pa, greater than or equal to 13 Pa and less than or equal to 2000 Pa, greater than or equal to 67 Pa and less than or equal to 2000 Pa, greater than or equal to 133 Pa and less than or equal to 2000 Pa, greater than or equal to 667 Pa and less than or equal to 2000 Pa, greater than or equal to 1333 Pa and less than or equal to 2000 Pa, greater than or equal to 13 Pa and less than or equal to 1667 Pa, greater than or equal to 67 Pa and less than or equal to 1667 Pa, greater than or equal to 133 Pa and less than or equal to 1667 Pa, greater than or equal to 667 Pa and less than or equal to 1667 Pa, greater than or equal to 1333 Pa and less than or equal to 1667 Pa, greater than or equal to 13 Pa and less than or equal to 1333 Pa, greater than or equal to 67 Pa and less than or equal to 1333 Pa, greater than or equal to 333 Pa and less than or equal to 1333 Pa, greater than or equal to 1000 Pa and less than or equal to 1333 Pa, greater than or equal to 13 Pa and less than or equal to 1000 Pa, greater than or equal to 67 Pa and less than or equal to 1000 Pa, greater than or equal to 333 Pa and less than or equal to 1000 Pa, greater than or equal to 667 Pa and less than or equal to 1000 Pa, greater than or equal to 13 Pa and less than or equal to 667 Pa, greater than or equal to 67 Pa and less than or equal to 667 Pa, greater than or equal to 133 Pa and less than or equal to 667 Pa, greater than or equal to 333 Pa and less than or equal to 667 Pa, greater than or equal to 13 Pa and less than or equal to 333 Pa, greater than or equal to 67 Pa and less than or equal to 333 Pa, greater than or equal to 133 Pa and less than or equal to 333 Pa, greater than or equal to 13 Pa and less than or equal to 133 Pa, greater than or equal to 67 Pa and less than or equal to 133 Pa, or greater than or equal to 13 Pa and less than or equal to 67 Pa.

The second step through the fifth step of the ALD cycle may each be repeated until desired layer thickness is achieved. For example, to form a thick dielectric layer, the second step may be repeated before moving on to the third step, or the second and third step may be repeatedly consecutively before moving on to the fourth step. Similarly, to form a thick absorber layer, the fourth step may be repeated before moving on to the fifth step, or the fourth and fifth step may be repeatedly consecutively before moving on. Using the above steps for the ALD process, each layer of the multilayer structure can be conducted in the same chamber where the former layer was deposited by ALD. Using the same chamber to deposit different layer decreases the down time required in traditional processes where the substrates are removed from the chamber after depositing a first layer with a first precursor and loaded into a second chamber to deposit a second layer deposited with a second precursor.

Now the details of the ALD methods for making individual layers of a multilayer structures, which includes the dielectric layer, barrier layer, absorber layer, protective layer, and the outer-protective layer, will be described further.

In embodiments, a method of forming the multilayer structure that reflects an omnidirectional structural color by ALD, comprises introducing at least one reflective core particle into a reaction chamber; depositing a conformal dielectric layer encapsulating the at least one reflective core particle in a dielectric-layer ALD cycle; depositing a conformal barrier layer encapsulating the conformal dielectric layer in a barrier-layer ALD cycle; and depositing a conformal absorber layer encapsulating the conformal barrier layer in an absorber-layer ALD cycle. In embodiments, the at least one reflective core particle may comprise a conformal protective layer encapsulating the at least one reflective core particle. The conformal protective layer may, in embodiments, be formed by ALD, CVD, or wet chemistry methods. The method may further comprises depositing a conformal outer protective layer encapsulating the conformal absorber layer in an outer-protective-layer ALD cycle.

In embodiments, the method may further comprise depositing a second conformal barrier layer encapsulating the conformal absorber layer in a second barrier-layer ALD cycle; and depositing a second conformal dielectric layer encapsulating the second conformal barrier layer in a second dielectric-layer ALD cycle. This method may further comprise depositing a conformal outer protective layer encapsulating the second conformal dielectric layer in an outer-protective-layer ALD cycle.

Each of the aforementioned ALD cycles will now be described.

In embodiments, the dielectric-layer ALD cycle comprises, in sequence, supplying a dielectric-layer precursor comprising two components into the reaction chamber. In embodiments, the first component is selected from the group consisting of halides, alkyl, alkoxides, alkylamides, and carbonyls of Ti, Zn, Zr, Hf, Fe, Al, Pb, Ga, In, Si, Mg, K, and combinations thereof. Then the reaction chamber is purged with a purge gas selected from the group consisting of nitrogen, argon, and combinations thereof. A second component selected from the group consisting of $O_2$, $O_3$, $H_2O$, $H_2O_2$, $As_2O_3$, $As_2O_5$, $H_2S$, $S_2$, $Br_2$, HF, $NH_4F$, $SF_6$, and combinations thereof is introduced into the reaction chamber. Finally, the reaction chamber is purged with a purge gas selected from the group consisting of nitrogen, argon, and combinations thereof.

In embodiments, the barrier-layer ALD cycle comprises, in sequence, supplying a barrier-layer precursor comprising two components into the reaction chamber. In embodiments, the first component is selected from the group consisting of halides, alkyl, alkoxides, alkylamides, and carbonyls of Al, Si, Mg, K, Zn, and combinations thereof. Then the reaction chamber is purged with a purge gas selected from the group consisting of nitrogen, argon, and combinations thereof. A second component selected from the group consisting of $O_2$, $O_3$, $H_2O$, $H_2O_2$, $Br_2$, HF, $NH_4F$, and combinations thereof is introduced into the reaction chamber. Finally, the reaction chamber is purged with a purge gas selected from the group consisting of nitrogen, argon, and combinations thereof.

In embodiments, the absorber-layer ALD cycle comprises, in sequence, supplying an absorber-layer precursor comprising two components into the reaction chamber. In embodiments, the first component is selected from the group consisting of halides, alkyl, alkoxides, alkylamides, and carbonyls of W, Cr, Ge, Ni, Pd, Ti, Si, V, Co, Mo, Nb, and combinations thereof. Then the reaction chamber is purged with a purge gas selected from the group consisting of nitrogen, argon, and combinations thereof. A second component selected from the group consisting of $SiH_4$, $Si_2H_6$, $BH_3$, $B_2H_6$, $H_2$, $N_2$, $NH_3$, $O_2$, $O_3$, $H_2O$, $H_2O_2$, and combinations thereof is introduced into the reaction chamber. Finally the reaction chamber is purged with a purge gas selected from the group consisting of nitrogen, argon, and combinations thereof.

In embodiments, the second barrier-layer ALD cycle comprises, in sequence, supplying a second barrier-layer precursor comprising two components into the reaction chamber. In embodiments, the first component is selected from the group consisting of halides, alkyl, alkoxides, alkylamides, and carbonyls of Al, Si, Mg, K, Zn, and combinations thereof. Then the reaction chamber is purged with a purge gas selected from the group consisting of nitrogen, argon, and combinations thereof. A second component selected from the group consisting of $O_2$, $O_3$, $H_2O$, $H_2O_2$, $Br_2$, HF, $NH_4F$, and combinations thereof is introduced into the reaction chamber. Finally the reaction chamber is purged with a purge gas selected from the group consisting of nitrogen, argon, and combinations thereof.

In embodiments, the second dielectric-layer ALD cycle comprises, in sequence, supplying a second dielectric-layer precursor comprising two components into the reaction chamber. In embodiments, the first component is selected from the group consisting of halides, alkyl, alkoxides, alkylamides, and carbonyls of Ti, Zn, Zr, Hf, Fe, Al, Pb, Ga, In, Si, Mg, K, and combinations thereof. Then the reaction chamber is purged with a purge gas selected from the group consisting of nitrogen, argon, and combinations thereof. A second component selected from the group consisting of $O_2$, $O_3$, $H_2O$, $H_2O_2$, $As_2O_3$, $As_2O_5$, $H_2S$, $S_2$, $Br_2$, HF, $NH_4F$, $SF_6$, and combinations thereof is introduced into the reaction chamber. Finally, the reaction chamber is purged with a purge gas selected from the group consisting of nitrogen, argon, and combinations thereof.

In embodiments, the outer-protective-layer ALD cycle comprises, in sequence, supplying an outer-protective-layer precursor comprising two components into the reaction chamber. In embodiments, the first component is selected from the group consisting of halides, alkyl, alkoxides, alkylamides, and carbonyls of Al, Si, Mg, K, Zn, and combinations thereof. Then the reaction chamber is purged with a purge gas selected from the group consisting of nitrogen, argon, and combinations thereof. A second component selected from the group consisting of $O_2$, $O_3$, $H_2O$, $H_2O_2$, $Br_2$, HF, $NH_4F$, and combinations thereof is introduced into the reaction chamber. Finally, the reaction chamber is purged with a purge gas selected from the group consisting of nitrogen, argon, and combinations thereof.

The multilayer structures are coated with an outer protective layer of $Al_2O_3$ where trimethyl aluminum (TMA) and water are used as precursors to form the protective layer in the reactor.

The as-formed multilayer structures by using the above ALD methods will now be described.

In embodiments, the at least one reflective core particle 110 may be made from at least one of a “gray metallic” material, such as Al, Ag, Pt, Sn; at least one of a “colorful metallic” material, such as Au, Cu, brass, bronze, TiN, Cr, stainless steel, or a combination thereof. In one or more embodiments, the at least one reflective core particle 110 may be selected the group consisting of Au, Cu, Al, brass, bronze, TiN, Cr, stainless steel, alumina ($Al_2O_3$), silica ($SiO_2$), bismuth oxychloride, glass materials, mica, and combinations thereof. The substrate 110 can have plate-like shape or can be spherical or ovoid, as mentioned above.

In embodiments, the conformal dielectric layer 120 may be selected from the group consisting of $TiO_2$, ZnS, $ZrO_2$, $HfO_2$, $Fe_3O_4$, AlAs, $Fe_2O_3$, PbS, GaAs, InAs, $SiO_2$, $MgF_2$, KBr, ZnO, $Al_2O_3$, and combinations thereof. In embodiments, the conformal dielectric layer 120 may be a high refractive index material such as $TiO_2$, which is present in a rutile or anatase phase, a low refractive index material such as $SiO_2$, or $Fe_2O_3$.

In embodiments, the conformal absorber layer 130 may be selected from the group consisting of W, Cr, Ge, Ni, stainless steel, Pd, Ti, Si, V, TiN, Co, Mo, Nb, ferric oxide, and combinations thereof.

In embodiments, a multilayer structure comprises a protective layer 111 encapsulating the substrate 110, the conformal protective layer 111 may be a dense layer selected from the group consisting of $SiO_2$, $Al_2O_3$, $Fe_2O_3$, and combinations thereof. The protective layer 111 may also be deposited by chemical vapor deposition (CVD), physical vapor deposition (PVD), or wet chemical (WC) methods, depending on the thickness and material of the protective layer.

In embodiments, a multilayer structure further comprises a conformal barrier layer 121 positioned between the conformal dielectric layer 120 and the conformal absorber layer 130, the conformal barrier layer 121 may be selected from the group consisting of $Al_2O_3$, $SiO_2$, $MgF_2$, KBr, ZnO, and combinations thereof.

In embodiments, a multilayer structure may be encapsulated by an optional conformal outer protective layer encapsulating the conformal absorber layer 130, the optional conformal outer protective layer can be selected from the group consisting of $SiO_2$, $Al_2O_3$, organosilane, organic phosphine, phosphates, and combinations thereof.

Specifically, in embodiments, a multilayer structure 100 can comprise an at least one reflective core particle 110 comprising Al; a conformal dielectric layer 120 comprising $TiO_2$ or $Fe_2O_3$; a conformal barrier layer 121 comprising $Al_2O_3$; and a conformal absorber layer 130 comprising W.

Referring again to FIG. 1, a multilayer structure 100 according to embodiments disclosed and described herein comprises a substrate 110, a conformal dielectric layer 120 that encapsulates the substrate 110, a conformal absorber layer 130 that encapsulates the conformal dielectric layer 120, and a second conformal dielectric layer 140 that encapsulates the conformal absorber layer 130. Multilayer structures 100 disclosed and described herein consist of four “optical layers”—the substrate 110, the dielectric layer 120, the absorber layer 130, and the second dielectric layer. These four optical layers effect the optics of the multilayer structure 100. The term “optical layers” as used herein does not include the barrier layers, the protective layer, and the outer protective layer that do not affect the optics of the multilayer structure.

In embodiments where a multilayer structure 100 further comprise a second conformal dielectric layer 140, the second conformal dielectric layer 140 may be selected from the group consisting of $TiO_2$, ZnS, $ZrO_2$, $HfO_2$, $Fe_3O_4$, AlAs, $Fe_2O_3$, PbS, GaAs, InAs, $SiO_2$, $MgF_2$, KBr, ZnO, $Al_2O_3$, and combinations thereof. In embodiments, the second conformal dielectric layer 140 may be a high refractive index material such as $TiO_2$, which is present in a rutile or anatase phase, a low refractive index material such as $SiO_2$, or $Fe_2O_3$.

In embodiments, a multilayer structure further comprises a second conformal barrier layer 131 positioned between the conformal absorber layer 130 and the second conformal dielectric layer 140, the second conformal barrier layer 131 may be selected from the group consisting of $Al_2O_3$, $SiO_2$, $MgF_2$, KBr, ZnO, and combinations thereof.

In embodiments, a multilayer structure can be encapsulated by a conformal outer protective layer 141 encapsulating the second conformal dielectric layer 140, the conformal outer protective layer 141 may be selected from the group consisting of $SiO_2$, $Al_2O_3$, organosilane, organic phosphine, phosphates, and combinations thereof.

Specifically, in embodiments, a multilayer structure may comprise an at least one reflective core particle 110 comprising Al; a conformal protective layer 111 comprising $SiO_2$ or $Al_2O_3$; a conformal dielectric layer 120 comprising $TiO_2$ or $Fe_2O_3$; a conformal barrier layer 121 comprising $Al_2O_3$; a conformal absorber layer 130 comprising W; a second conformal barrier layer 131 comprising $SiO_2$ or $Al_2O_3$; and a second conformal dielectric layer 140 comprising $TiO_2$ or $Fe_2O_3$.

As noted above, the layer thickness and material affects the optical properties of OSC multilayer structures, and ALD disclosed herein provide ultrathin layer deposition with nanoscale precision and minimal cross-layer material infiltration. The optical properties of OSC multilayer structures will now be described.

The optics of an OSC multilayer structure is effected by optical layers of the multilayer structure. Referring again to FIG. 1, a multilayer structure 100 according to embodiments disclosed and described herein comprises a substrate 110, a conformal dielectric layer 120 that encapsulates the substrate 110, and a conformal absorber layer 130 that encapsulates the conformal dielectric layer 120. Multilayer structures 100 disclosed and described herein consist of three "optical layers"—the substrate 110, the dielectric layer 120, and the absorber layer 130. These three optical layers effect the optics of the multilayer structure 100. The term "optical layers" as used herein does not include the barrier layers, the protective layer, and the outer protective layer that do not affect the optics of the multilayer structure.

Figure 3A:
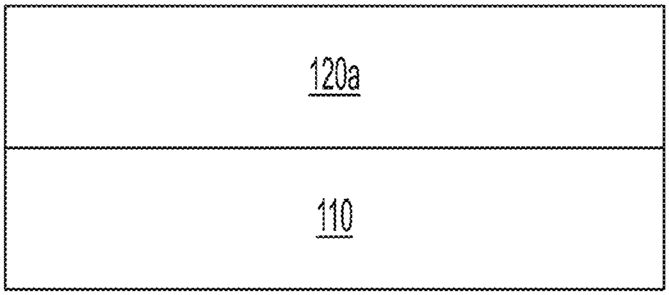
FIG. 3A depicts a multilayer structure with a ZnS dielectric layer extending over an Al reflective core layer used in the design of a multilayer structure.
Figure 3B:
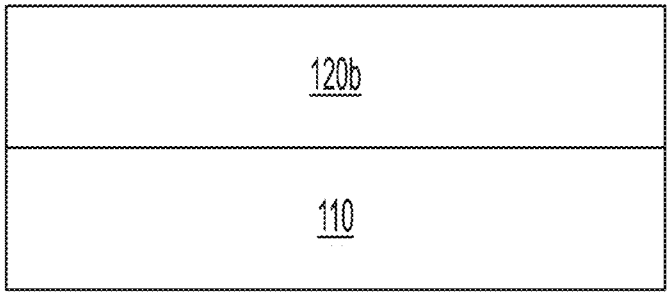
FIG. 3B depicts a multilayer structure with a Si semiconductor absorber layer extending over an Al reflective core layer used in the design of a multilayer structure.
Figure 3C:
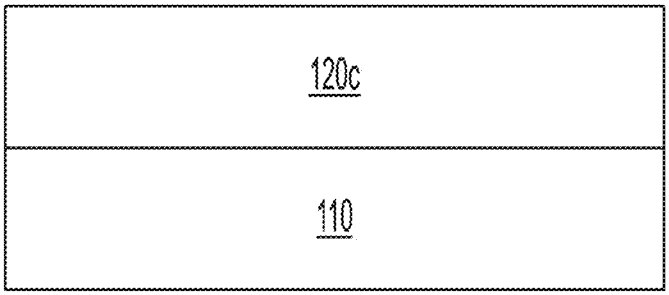
FIG. 3C depicts a multilayer structure with an $Fe_2O_3$ dielectric layer extending over an Al reflective core layer used in the design of multilayer structure according to one or more embodiments shown and described herein.

In general, the optics of multilayer structures—such as the absorbing and reflecting wavelengths, the chroma, and the hue—depend on the architectures of multilayer structures. The effect of the layer configuration on the chroma and the hue of the multilayer structures will now be described. For instances, FIGS. 3A-3C and 4 depicts the simulated effectiveness of different multilayer structures in attaining a desired hue level in a red region of the visible light spectrum as plotted or shown on a Lab color space. As illustrated in FIGS. 3A-3C, this simulation considers three simple multilayer structures, wherein each multilayer structures individually has two optical layers including a reflective core particle and a first layer that is a dielectric layer or an absorber layer encapsulating the reflective core particle. FIG. 3A depicts a ZnS dielectric layer **120*a* extending across a reflective core layer 110, FIG. 3B depicts a Si semiconductor absorber layer 120*b* extending across a reflective core layer 110, and FIG. 3C depicts an $Fe_2O_3$ absorber layer 120*c* extending across a reflective core layer 110. Simulations of the reflectance from each multilayer structure illustrated in FIGS. 2A-2C are performed as a function of different thicknesses for the dielectric layer 120*a*, the semiconductor absorber layer 120*b*, and absorber layer 120*c***.

Figure 4:
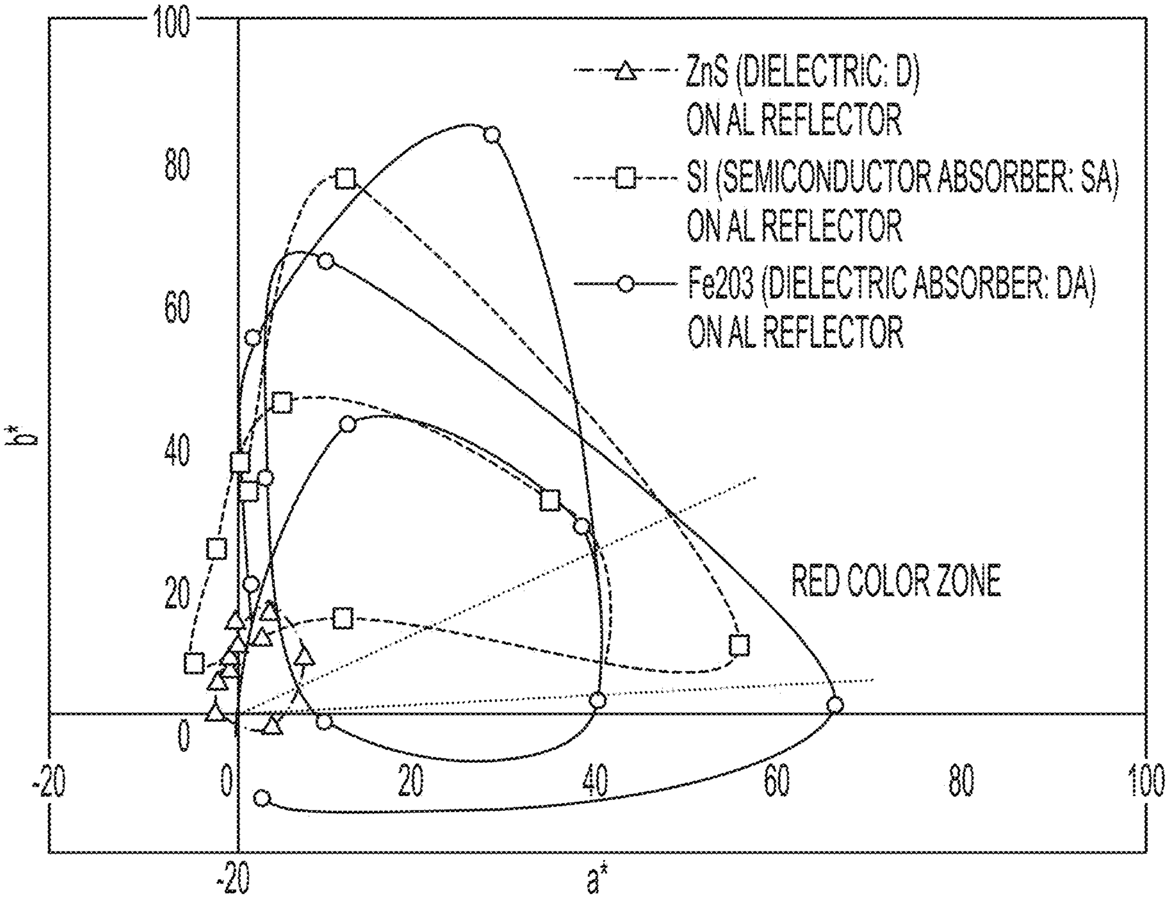
FIG. 4 depicts reflectance properties of the multilayer structures illustrated in FIGS. 3A-3C on a Lab color space.

Referring to FIG. 4, the results of the simulations are plotted on a Lab color space, also known as an a*b* color map. Each data point shown in FIG. 4 provides a chroma and a hue for particular thickness of the ZnS dielectric layer for the first multilayer structure, the Si semiconductor absorber layer for the second multilayer structure, or the $Fe_2O_3$ dielectric absorber layer for the third multilayer structure.

A chroma value provides a measure of the color's "brightness," and a hue value provides a measure of the color displayed by an object (e.g., red, green, blue, yellow etc.). The hue can also be referred to as the angle relative to the positive a*-axis of a given data point. Chroma can be defined as, and hue can be defined as $\tan^{-1}(a^*/b^*)$, on a Lab color space, also known as an a*b* color map. As shown in FIG. 4, the multilayer structure illustrated in FIG. 3A provides low chroma compared to the multilayer structures illustrated in FIGS. 3B and 3C. Accordingly, FIGS. 3A-3C and FIG. 4 demonstrate that an absorber layer, (e.g., an absorber layer) is preferred over a dielectric layer as a first layer extending over a reflective core layer when colors with high chroma are desired. It should be understood that the Lab color space analysis shown in FIG. 4 is for illustrative purposes and that multilayer structures according to embodiments disclosed and described herein may have different Lab color space values. For instance, in embodiments, the multilayer structures could exhibit a blue, green, yellow, or other colors in the Lab color space.

Figure 5A:
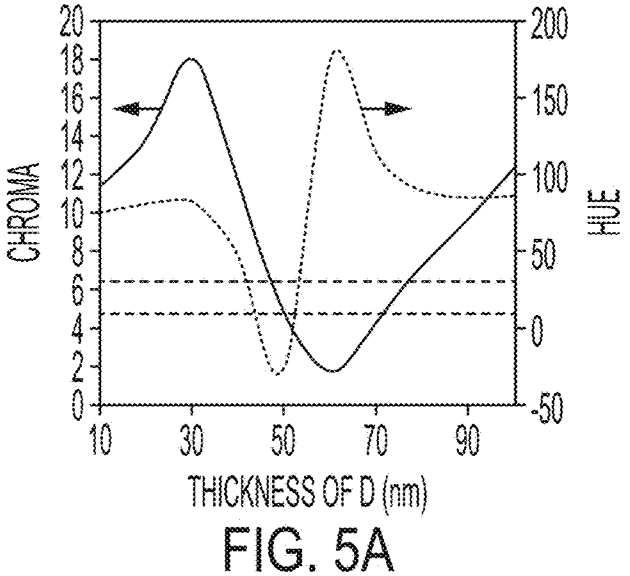
FIG. 5A graphically depicts chroma and hue values as a function of ZnS dielectric layer thickness for the multilayer structures illustrated in FIG. 3A.
Figure 5B:
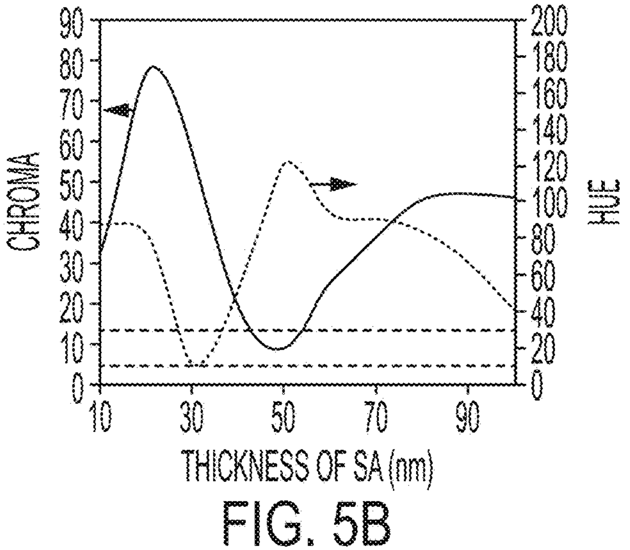
FIG. 5B graphically depicts chroma and hue values as a function of Si semiconductor absorber layer thickness for the multilayer structure illustrated in FIG. 3B.
Figure 5C:
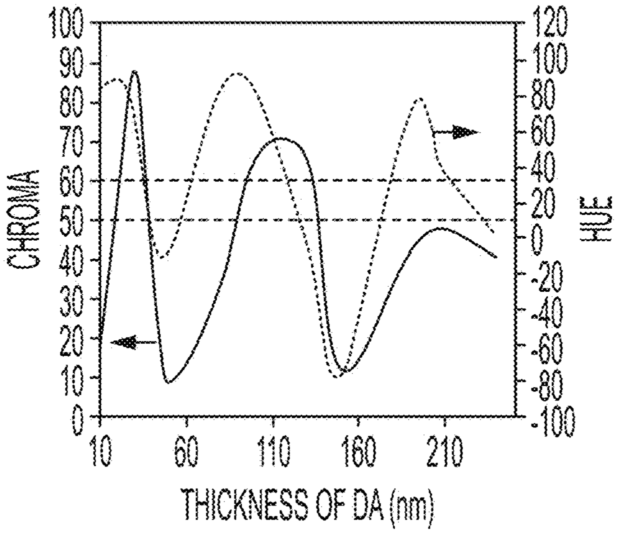
FIG. 5C graphically depicts chroma and hue values as a function of $Fe_2O_3$ dielectric layer thickness for the multilayer structure illustrated in FIG. 3C.

The effect of the layer thickness on the chroma and the hue of the three multilayer structures will now be described. Referring to FIGS. 5A-5C, chroma and hue as a function of layer thickness is depicted. Specifically, FIG. 5A graphically depicts the chroma and hue as a function of the thickness of the ZnS dielectric layer extending over the Al reflective core layer illustrated in FIG. 3A. FIG. 5B depicts the chroma and hue as a function of the thickness of the Si semiconductor absorber layer extending over the Al reflective core layer illustrated in FIG. 3B. FIG. 5C depicts the chroma and hue as a function of the thickness of the $Fe_2O_3$ absorber layer extending over the Al reflective core layer illustrated in FIG. 5C. The dotted lines in FIGS. 5A-5C correspond to desired hue values between 10° and 30° on the Lab color space. FIGS. 5A-5C illustrate that higher chroma values within the hue range between 10° and 30° are achieved for multilayer structures having a absorber layer extending across the reflective core layer. Again, it should be understood that the hue and chroma shown in FIG. 5A-5C is for illustrative purposes and that multilayer structures according to embodiments disclosed and described herein may have different hue and chroma values.

The effect of the layer thickness on the absorbing and reflecting wavelengths will now be described. Assuming a multilayer structure comprising three optical layers as depicted in FIG. 1, the conformal absorber layer 130 encapsulates the conformal dielectric layer 120, which encapsulates the reflective core particle 110, and the location of the conformal absorber layer is chosen to increase the absorption of target light wavelengths. For instance, if the multilayer structure is to be configured to absorb electromagnetic radiation having wavelengths that are less than or equal to 550 nm but reflect electromagnetic radiation with wavelengths of approximately 650 nm, such as visible light outside of the hue between 10° and 30°, the absorber layer is placed at a thickness where the electric field ($|E|^2$) is less at the 550 nm wavelength than at the 650 nm wavelength. Mathematically, this can be expressed as:

$$|E_{550}|^2 \ll |E_{650}|^2 \tag{1}$$

and preferably:

$$|E_{650}|^2 \approx 0 \tag{2}$$

Figure 6:
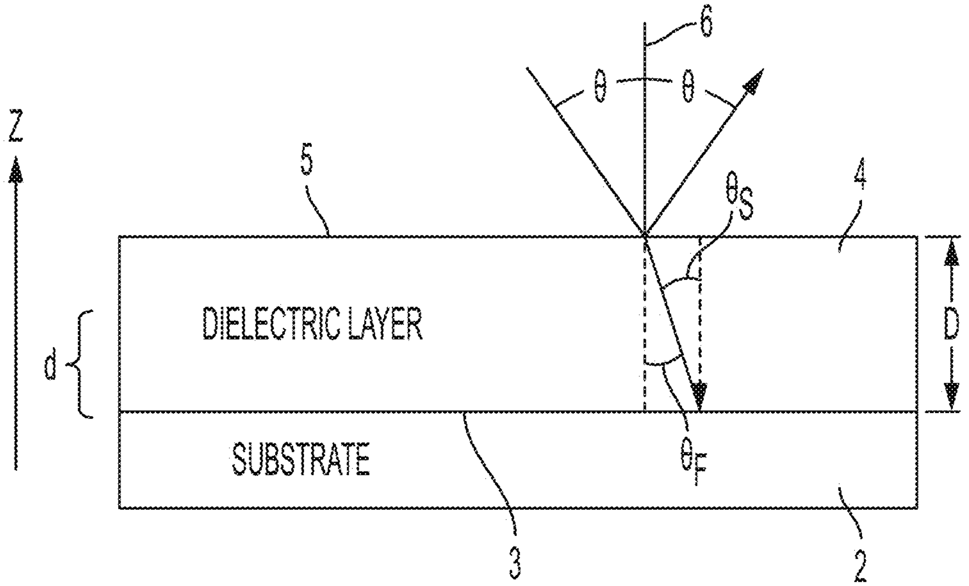
FIG. 6 depicts a multilayer structure with a dielectric layer extending over a substrate layer and exposed to electromagnetic radiation at an angle θ relative to a normal direction to the outer surface of the dielectric layer.

FIG. 6 and the following discussion provide a method for calculating the thickness of a zero or near-zero electric field point at a given wavelength of light, according to embodiments. For the purposes of the present specification, the term "near-zero" is defined $|E|^2 \leq 10$. FIG. 6 illustrates a multilayer structure with a dielectric layer 4 having a total thickness "D", an incremental thickness "d" and an index of refraction "n" on a substrate layer 2 having an index of refraction "$n_s$". The substrate layer 2 can be a core layer, a core particle, a reflective core layer, or a reflective core particle of a multilayer structure. Incident light strikes the outer surface 5 of the dielectric layer 4 at angle θ relative to line 6, which is perpendicular to the outer surface 5, and reflects from the outer surface 5 at the same angle θ. Incident light is transmitted through the outer surface 5 and into the dielectric layer 4 at an angle $\theta_F$ relative to the line 6 and strikes the surface 3 of substrate layer 2 at an angle $\theta_s$. For a single dielectric layer, $\theta_s = \theta_F$ and the energy/electric field (E) can be expressed as E(z) when z=d. From Maxwell's equations, the electric field can be expressed for s polarization as:

$$\vec{E}(d) = \{u(z), 0, 0\}\exp(ik\alpha y)|_{z=d} \tag{3}$$

and for p polarization as:

$$\vec{E}(d) = \left\{0, u(z), -\frac{\alpha}{\tilde{\varepsilon}(z)}v(z)\right\}\exp(ik\alpha y)|_{z=d} \tag{4}$$

where $$k = \frac{2\pi}{\lambda},$$

λ is a desired wavelength to be reflected, $\alpha = n_s \sin\theta_s$, where "s" corresponds to the substrate, and $\tilde{\varepsilon}(z)$ is the permittivity of the layer as a function of z. As such:

$$|E(d)|^2 = |u(z)|^2\exp(2ik\alpha y)|_{z=d} \tag{5}$$

for s polarization, and $$|E(d)|^2 = \left[|u(z)|^2 + \left|\frac{\alpha}{\sqrt{n}}v(z)\right|^2\right]\exp(2ik\alpha y)|_{z=d} \tag{6}$$

for p polarization.

It should be appreciated that variation of the electric field along the Z direction of the dielectric layer 4 can be estimated by calculation of the unknown parameters u(z) and v(z), where it can be shown that:

$$\begin{pmatrix} u \\ v \end{pmatrix}_{z=d} = \begin{pmatrix} \cos\varphi & (i/q)\sin\varphi \\ iq\sin\varphi & \cos\varphi \end{pmatrix}\begin{pmatrix} u \\ v \end{pmatrix}_{z=0,substrate} \tag{7}$$

where 'i' is the square root of −1, and φ is the phase thickness of the dielectric layer 4. Using the boundary conditions $u|_{z=0}=1$, $v|_{z=0}=q$, and the following relations:

$$q_s = n_s\cos\theta_s \text{ for s-polarization} \tag{8}$$

$$q_s = n_s/\cos\theta_s \text{ for p-polarization} \tag{9}$$

$$q = n\cos\theta_F \text{ for s-polarization} \tag{10}$$

$$q = n/\cos\theta_F \text{ for p-polarization} \tag{11}$$

$$\varphi = k\cdot n\cdot d\cos(\theta_F) \tag{12}$$

u(z) and v(z) can be expressed as:

$$\begin{aligned} u(z)|_{z=d} &= u|_{z=0}\cos\varphi + v|_{z=0}\left(\frac{i}{q}\sin\varphi\right) \\ &= \cos\varphi + \frac{i.q_s}{q}\sin\varphi \end{aligned} \tag{13}$$

and $$\begin{aligned} v(z)|_{z=d} &= iqu|_{z=0}\sin\varphi + v|_{z=0}\cos\varphi \\ &= iq\sin\varphi + q_s\cos\varphi \end{aligned} \tag{14}$$

Therefore:

$$\begin{aligned} |E(d)|^2 &= \left[\cos^2\varphi + \frac{q_s^2}{q^2}\sin^2\varphi\right]e^{2ik\alpha\gamma} \\ &= \left[\cos^2\varphi + \frac{n_s^2}{n^2}\sin^2\varphi\right]e^{2ik\alpha\gamma} \end{aligned} \tag{15}$$

for s polarization with $\varphi = k\cdot n\cdot d\cos(\theta_F)$, and:

$$\begin{aligned} |E(d)|^2 &= \left[\cos^2\varphi + \frac{n_s^2}{n^2}\sin^2\varphi + \frac{\alpha^2}{n}\left(q_s^2\cos^2\varphi + q^2\sin^2\varphi\right)\right] \\ &= \left[\left(1 + \frac{\alpha^2 q_s^2}{n}\right)\cos^2\varphi + \left(\frac{n_s^2}{n^2} + \frac{\alpha^2 q^2}{n}\right)\sin^2\varphi\right] \end{aligned} \tag{16}$$

for p polarization where:

$$\alpha = n_s\sin\theta_s = n\sin\theta_F \tag{17}$$

$$q_s = \frac{n_s}{\cos\theta_s} \tag{18}$$

and $$q_s = \frac{n}{\cos\theta_F} \tag{19}$$

Thus for a simple situation where $\theta_F=0$ or normal incidence, $\varphi=k\cdot n\cdot d$, and $\alpha=0$:

$$|E(d)|^2 \text{ for s-polarization} = \tag{20}$$

$$|E(d)|^2 \text{ for p-polarization} = \left[\cos^2\varphi + \frac{n_s^2}{n^2}\sin^2\varphi\right] = \left[\cos^2(k\cdot n\cdot d) + \frac{n_s^2}{n^2}\sin^2(k\cdot n\cdot d)\right] \tag{21}$$

which allows for the thickness "d" to be solved for (i.e., the position or location within the dielectric layer where the electric field is zero). It should be appreciated that the thickness "d" can be the thickness of the first conformal dielectric layer 120, the first conformal barrier layer 121, and the first conformal protective layer 111 that encapsulate the core particle 110 and that provides a zero or near zero electric field at the interface between the first conformal dielectric layer 120 and the conformal absorber layer 130. It should also be appreciated that the thickness "d" can also be the thickness of the second conformal dielectric layer 140 encapsulating the second conformal protective layer 131 that provides a zero or near zero electric field at the interface between the second conformal dielectric layer 140 and the conformal absorber layer 130, depending on the thickness "d" where the electric field is zero or near-zero.

According to one or more embodiments, the conformal dielectric layer 120 may have a thickness that is greater than or equal to 5 nm and less than or equal to 500 nm, such as greater than or equal to 50 nm and less than or equal to 500 nm, greater than or equal to 100 nm and less than or equal to 500 nm, greater than or equal to 200 nm and less than or equal to 500 nm, greater than or equal to 300 nm and less than or equal to 500 nm, greater than or equal to 400 nm and less than or equal to 500 nm, greater than or equal to 450 nm and less than or equal to 500 nm, greater than or equal to 475 nm and less than or equal to 500 nm, greater than or equal to 5 nm and less than or equal to 475 nm, greater than or equal to 50 nm and less than or equal to 475 nm, greater than or equal to 100 nm and less than or equal to 475 nm, greater than or equal to 200 nm and less than or equal to 475 nm, greater than or equal to 300 nm and less than or equal to 475 nm, greater than or equal to 400 nm and less than or equal to 475 nm, greater than or equal to 450 nm and less than or equal to 475 nm, greater than or equal to 5 nm and less than or equal to 450 nm, greater than or equal to 50 nm and less than or equal to 450 nm, greater than or equal to 100 nm and less than or equal to 450 nm, greater than or equal to 200 nm and less than or equal to 450 nm, greater than or equal to 300 nm and less than or equal to 450 nm, greater than or equal to 400 nm and less than or equal to 450 nm, greater than or equal to 425 nm and less than or equal to 450 nm, greater than or equal to 5 nm and less than or equal to 400 nm, greater than or equal to 50 nm and less than or equal to 400 nm, greater than or equal to 100 nm and less than or equal to 400 nm, greater than or equal to 200 nm and less than or equal to 400 nm, greater than or equal to 300 nm and less than or equal to 400 nm, greater than or equal to 350 nm and less than or equal to 400 nm, greater than or equal to 5 nm and less than or equal to 350 nm, greater than or equal to 50 nm and less than or equal to 350 nm, greater than or equal to 100 nm and less than or equal to 350 nm, greater than or equal to 200 nm and less than or equal to 350 nm, greater than or equal to 300 nm and less than or equal to 350 nm, greater than or equal to 325 nm and less than or equal to 350 nm, greater than or equal to 5 nm and less than or equal to 300 nm, greater than or equal to 50 nm and less than or equal to 300 nm, greater than or equal to 100 nm and less than or equal to 300 nm, greater than or equal to 200 nm and less than or equal to 300 nm, greater than or equal to 250 nm and less than or equal to 300 nm, greater than or equal to 5 nm and less than or equal to 250 nm, greater than or equal to 50 nm and less than or equal to 250 nm, greater than or equal to 100 nm and less than or equal to 250 nm, greater than or equal to 200 nm and less than or equal to 250 nm, greater than or equal to 5 nm and less than or equal to 200 nm, greater than or equal to 50 nm and less than or equal to 200 nm, greater than or equal to 100 nm and less than or equal to 200 nm, greater than or equal to 150 nm and less than or equal to 200 nm, greater than or equal to 5 nm and less than or equal to 100 nm, greater than or equal to 50 nm and less than or equal to 100 nm, greater than or equal to 75 nm and less than or equal to 100 nm, greater than or equal to 5 nm and less than or equal to 50 nm, greater than or equal to 15 nm and less than or equal to 50 nm, greater than or equal to 30 nm and less than or equal to 50 nm, greater than or equal to 5 nm and less than or equal to 30 nm, greater than or equal to 15 nm and less than or equal to 30 nm, or greater than or equal to 5 nm and less than or equal to 15 nm.

In embodiments, the conformal absorber layer 130 may have a thickness that is greater than or equal to 2 nm and less than or equal to 50 nm, such as greater than or equal to 2 nm and less than or equal to 45 nm, greater than or equal to 2 nm and less than or equal to 40 nm, greater than or equal to 2 nm and less than or equal to 35 nm, greater than or equal to 2 nm and less than or equal to 30 nm, greater than or equal to 2 nm and less than or equal to 25 nm, greater than or equal to 2 nm and less than or equal to 20 nm, greater than or equal to 5 nm and less than or equal to 20 nm, greater than or equal to 8 nm and less than or equal to 20 nm, greater than or equal to 10 nm and less than or equal to 20 nm, greater than or equal to 12 nm and less than or equal to 20 nm, greater than or equal to 15 nm and less than or equal to 20 nm, greater than or equal to 18 nm and less than or equal to 20 nm, greater than or equal to 2 nm and less than or equal to 18 nm, greater than or equal to 5 nm and less than or equal to 18 nm, greater than or equal to 8 nm and less than or equal to 18 nm, greater than or equal to 10 nm and less than or equal to 18 nm, greater than or equal to 12 nm and less than or equal to 18 nm, greater than or equal to 15 nm and less than or equal to 18 nm, greater than or equal to 2 nm and less than or equal to 15 nm, greater than or equal to 5 nm and less than or equal to 15 nm, greater than or equal to 8 nm and less than or equal to 15 nm, greater than or equal to 10 nm and less than or equal to 15 nm, greater than or equal to 12 nm and less than or equal to 15 nm, greater than or equal to 2 nm and less than or equal to 12 nm, greater than or equal to 5 nm and less than or equal to 12 nm, greater than or equal to 8 nm and less than or equal to 12 nm, greater than or equal to 10 nm and less than or equal to 12 nm, greater than or equal to 2 nm and less than or equal to 10 nm, greater than or equal to 5 nm and less than or equal to 10 nm, greater than or equal to 8 nm and less than or equal to 10 nm, greater than or equal to 2 nm and less than or equal to 8 nm, greater than or equal to 5 nm and less than or equal to 8 nm, or greater than or equal to 2 nm and less than or equal to 5 nm.

In embodiments, the second conformal dielectric layer 140 may have a thickness that is greater than or equal to 5 nm and less than or equal to 500 nm, such as greater than or equal to 50 nm and less than or equal to 500 nm, greater than or equal to 100 nm and less than or equal to 500 nm, greater than or equal to 200 nm and less than or equal to 500 nm, greater than or equal to 300 nm and less than or equal to 500 nm, greater than or equal to 400 nm and less than or equal to 500 nm, greater than or equal to 450 nm and less than or equal to 500 nm, greater than or equal to 475 nm and less than or equal to 500 nm, greater than or equal to 5 nm and less than or equal to 475 nm, greater than or equal to 50 nm and less than or equal to 475 nm, greater than or equal to 100 nm and less than or equal to 475 nm, greater than or equal to 200 nm and less than or equal to 475 nm, greater than or equal to 300 nm and less than or equal to 475 nm, greater than or equal to 400 nm and less than or equal to 475 nm, greater than or equal to 450 nm and less than or equal to 475 nm, greater than or equal to 5 nm and less than or equal to 450 nm, greater than or equal to 50 nm and less than or equal to 450 nm, greater than or equal to 100 nm and less than or equal to 450 nm, greater than or equal to 200 nm and less than or equal to 450 nm, greater than or equal to 300 nm and less than or equal to 450 nm, greater than or equal to 400 nm and less than or equal to 450 nm, greater than or equal to 425 nm and less than or equal to 450 nm, greater than or equal to 5 nm and less than or equal to 400 nm, greater than or equal to 50 nm and less than or equal to 400 nm, greater than or equal to 100 nm and less than or equal to 400 nm, greater than or equal to 200 nm and less than or equal to 400 nm, greater than or equal to 300 nm and less than or equal to 400 nm, greater than or equal to 350 nm and less than or equal to 400 nm, greater than or equal to 5 nm and less than or equal to 350 nm, greater than or equal to 50 nm and less than or equal to 350 nm, greater than or equal to 100 nm and less than or equal to 350 nm, greater than or equal to 200 nm and less than or equal to 350 nm, greater than or equal to 300 nm and less than or equal to 350 nm, greater than or equal to 325 nm and less than or equal to 350 nm, greater than or equal to 5 nm and less than or equal to 300 nm, greater than or equal to 50 nm and less than or equal to 300 nm, greater than or equal to 100 nm and less than or equal to 300 nm, greater than or equal to 200 nm and less than or equal to 300 nm, greater than or equal to 250 nm and less than or equal to 300 nm, greater than or equal to 5 nm and less than or equal to 250 nm, greater than or equal to 50 nm and less than or equal to 250 nm, greater than or equal to 100 nm and less than or equal to 250 nm, greater than or equal to 200 nm and less than or equal to 250 nm, greater than or equal to 5 nm and less than or equal to 200 nm, greater than or equal to 50 nm and less than or equal to 200 nm, greater than or equal to 100 nm and less than or equal to 200 nm, greater than or equal to 150 nm and less than or equal to 200 nm, greater than or equal to 5 nm and less than or equal to 100 nm, greater than or equal to 50 nm and less than or equal to 100 nm, greater than or equal to 75 nm and less than or equal to 100 nm, greater than or equal to 5 nm and less than or equal to 50 nm, greater than or equal to 15 nm and less than or equal to 50 nm, greater than or equal to 30 nm and less than or equal to 50 nm, greater than or equal to 5 nm and less than or equal to 30 nm, greater than or equal to 15 nm and less than or equal to 30 nm, or greater than or equal to 5 nm and less than or equal to 15 nm.

In embodiments, the conformal barrier layer 121 may have a thickness that is less than or equal to 50 nm, such as less than or equal to 48 nm, less than or equal to 45 nm, less than or equal to 42 nm, less than or equal to 40 nm, less than or equal to 38 nm, less than or equal to 35 nm, less than or equal to 32 nm, less than or equal to 30 nm, less than or equal to 28 nm, less than or equal to 25 nm, less than or equal to 22 nm, less than or equal to 20 nm, less than or equal to 18 nm, less than or equal to 15 nm, less than or equal to 12 nm, less than or equal to 10 nm, less than or equal to 8 nm, less than or equal to 5 nm, or less than or equal to 2 nm.

In embodiments, the second conformal barrier layer 131 may have a thickness that is less than or equal to 50 nm, such as less than or equal to 48 nm, less than or equal to 45 nm, less than or equal to 42 nm, less than or equal to 40 nm, less than or equal to 38 nm, less than or equal to 35 nm, less than or equal to 32 nm, less than or equal to 30 nm, less than or equal to 28 nm, less than or equal to 25 nm, less than or equal to 22 nm, less than or equal to 20 nm, less than or equal to 18 nm, less than or equal to 15 nm, less than or equal to 12 nm, less than or equal to 10 nm, less than or equal to 8 nm, less than or equal to 5 nm, or less than or equal to 2 nm.

According to one or more embodiments, the thickness of the outer protective layer 141 is less than or equal to 30 nm, such as less than or equal to 25 nm, less than or equal to 20 nm, less than or equal to 15 nm, or less than or equal to 20 nm. In embodiments, the thickness of the outer protective layer 141 is greater than or equal to 5 nm and less than or equal to 15 nm, such as greater than or equal to 6 nm and less than or equal to 14 nm, greater than or equal to 7 nm and less than or equal to 13 nm, or greater than or equal to 8 nm and less than or equal to 12 nm.

The thickness of the protective layer 111 is, according to one or more embodiments, greater than or equal to 3 nm and less than or equal to 15 nm, such as greater than or equal to 5 nm and less than or equal to 13 nm, greater than or equal to 7 nm and less than or equal to 11 nm, or greater than or equal to 8 nm and less than or equal to 10 nm.

As disclosed herein, using an ALD process allows the deposition of multiple layers with optical precision and a vast difference in material properties (such as dielectric materials vs. metallic materials as described above) at a large scale. Moreover, ALD processes allow for production of multilayer structures with high density, low porosity, and complete layer coverage all with nanometer-scale precision.

The isotherms were collected using nitrogen physisorption at 76 K to obtain the specific surface area (SSA) of the materials, by fitting 13 points collected from $P/P_0 \approx 0.06$-0.3 to the Brunauer-Emmett-Teller (BET) equation. Additional adsorption points were collected at various $P/P_0$, up to $P/P_0 \approx 0.95$, followed by desorption back to $P/P_0 \approx 0.06$. The total pore volume was determined by the volume of nitrogen adsorbed at $P/P_0 \sim 0.95$, and average pore diameter was calculated using the Barrett Joyner Halenda (BJH) method.

In one or more embodiments, each of the conformal dielectric layer 120, the conformal absorber layer 130, and the second conformal dielectric layer 140 individually has a pore volume that may be less than or equal to 0.030 $cm^3/g$, such as less than or equal to 0.025 $cm^3/g$, less than or equal to 0.020 $cm^3/g$, less than or equal to 0.015 $cm^3/g$, less than or equal to 0.010 $cm^3/g$, less than or equal to 0.009 $cm^3/g$, less than or equal to 0.008 $cm^3/g$, less than or equal to 0.007 $cm^3/g$, less than or equal to 0.006 $cm^3/g$, less than or equal to 0.005 $cm^3/g$ pore volume, less than or equal to 0.004 $cm^3/g$, less than or equal to 0.003 $cm^3/g$, less than or equal to 0.002 $cm^3/g$, less than or equal to 0.001 $cm^3/g$. It should be understood that in embodiments one or more of the conformal dielectric layer 120, the conformal absorber layer 130, and the second conformal dielectric layer 140 may have the same pore volume and in other embodiments one or more of the conformal dielectric layer 120, the conformal absorber layer 130, and the second conformal dielectric layer 140 may have different pore volume.

In one or more embodiments the surface area of the each of the conformal dielectric layer 120, the conformal absorber layer 130, and the second conformal dielectric layer 140 individually is less than or equal to 100 square meters per gram ($m^2/g$), such as less than or equal to 90 $m^2/g$, less than or equal to 85 $m^2/g$, less than or equal to 80 $m^2/g$, less than or equal to 75 $m^2/g$, less than or equal to 70 $m^2/g$, less than or equal to 65 $m^2/g$, less than or equal to 60 $m^2/g$, less than or equal to 55 $m^2/g$, less than or equal to 50 $m^2/g$, less than or equal to 45 $m^2/g$, less than or equal to 40 $m^2/g$, less than or equal to 35 $m^2/g$, less than or equal to 30 $m^2/g$, less than or equal to 25 $m^2/g$, less than or equal to 20 $m^2/g$, less than or equal to 15 $m^2/g$, less than or equal to 10 $m^2/g$, such as less than or equal to 9 $m^2/g$, less than or equal to 8 $m^2/g$, less than or equal to 7 $m^2/g$, less than or equal to 6 $m^2/g$, less than or equal to 5 $m^2/g$, less than or equal to 4 $m^2/g$, less than or equal to 3 $m^2/g$, less than or equal to 2 $m^2/g$, or less than or equal to 1 $m^2/g$. Accordingly, in embodiments, each of the layers may individually have a surface area that may be greater than or equal to 2 $m^2/g$ and less than or equal to 10 $m^2/g$, greater than or equal to 3 $m^2/g$ and less than or equal to 10 $m^2/g$, greater than or equal to 3 $m^2/g$ and less than or equal to 8 $m^2/g$, greater than or equal to 5 $m^2/g$ and less than or equal to 8 $m^2/g$, greater than or equal to 1 $m^2/g$ and less than or equal to 3 $m^2/g$, greater than or equal to 3 $m^2/g$ and less than or equal to 5 $m^2/g$, greater than or equal to 2 $m^2/g$ and less than or equal to 3 $m^2/g$, greater than or equal to 1 $m^2/g$ and less than or equal to 2 $m^2/g$, or greater than or equal to 0.5 $m^2/g$ and less than or equal to 1 $m^2/g$. It should be understood that in embodiments one or more of the conformal dielectric layer 120, the conformal absorber layer 130, and the second conformal dielectric layer 140 may have the same surface area and in other embodiments one or more of the first conformal dielectric layer 120, the conformal absorber layer 130, and the second conformal dielectric layer 140 may have different surface areas.

In embodiments, the multilayer structure may have a $D_{50}$ diameter. In embodiments, the $D_{50}$ diameter may be greater than or equal to 1 μm to less than or equal to 500 μm, such as greater than or equal to greater than or equal to 5 μm to less than or equal to 500 μm, 10 μm to less than or equal to 500 μm, greater than or equal to 25 μm to less than or equal to 500 μm, greater than or equal to 100 μm to less than or equal to 500 μm, greater than or equal to 200 μm to less than or equal to 500 μm, greater than or equal to 250 μm to less than or equal to 500 μm, greater than or equal to 300 μm to less than or equal to 500 μm, greater than or equal to 350 μm to less than or equal to 500 μm, greater than or equal to 400 μm to less than or equal to 500 μm, greater than or equal to 450 μm to less than or equal to 500 μm, greater than or equal to 10 μm to less than or equal to 450 μm, greater than or equal to 25 μm to less than or equal to 450 μm, greater than or equal to 100 μm to less than or equal to 450 μm, greater than or equal to 200 μm to less than or equal to 450 μm, greater than or equal to 250 μm to less than or equal to 450 μm, greater than or equal to 300 μm to less than or equal to 450 μm, greater than or equal to 350 μm to less than or equal to 450 μm, greater than or equal to 400 μm to less than or equal to 450 μm, greater than or equal to 10 μm to less than or equal to 400 μm, greater than or equal to 25 μm to less than or equal to 400 μm, greater than or equal to 100 μm to less than or equal to 400 μm, greater than or equal to 200 μm to less than or equal to 400 μm, greater than or equal to 250 μm to less than or equal to 400 μm, greater than or equal to 300 μm to less than or equal to 400 μm, greater than or equal to 350 μm to less than or equal to 400 μm, greater than or equal to 10 μm to less than or equal to 350 μm, greater than or equal to 25 μm to less than or equal to 350 μm, greater than or equal to 50 m to less than or equal to 350 μm, greater than or equal to 100 μm to less than or equal to 350 μm, greater than or equal to 200 μm to less than or equal to 350 μm, greater than or equal to 250 μm to less than or equal to 350 μm, greater than or equal to 300 μm to less than or equal to 350 μm, greater than or equal to 50 μm to less than or equal to 300 μm, greater than or equal to 100 μm to less than or equal to 300 μm, greater than or equal to 200 μm to less than or equal to 300 μm, greater than or equal to 250 μm to less than or equal to 300 μm, greater than or equal to 10 μm to less than or equal to 250 μm, greater than or equal to 25 μm to less than or equal to 250 μm, greater than or equal to 100 μm to less than or equal to 250 μm, greater than or equal to 200 μm to less than or equal to 250 μm, greater than or equal to 25 μm to less than or equal to 200 μm, greater than or equal to 100 μm to less than or equal to 200 μm, greater than or equal to 150 μm to less than or equal to 200 μm, greater than or equal to 10 μm to less than or equal to 150 μm, greater than or equal to 50 μm to less than or equal to 150 μm, greater than or equal to 100 μm to less than or equal to 150 μm, greater than or equal to 1 μm to less than or equal to 100 μm, greater than or equal to 5 μm to less than or equal to 100 μm, greater than or equal to 10 μm to less than or equal to 100 μm, greater than or equal to 25 μm to less than or equal to 100 μm, greater than or equal to 50 μm to less than or equal to 100 μm, greater than or equal to 1 μm to less than or equal to 50 μm, greater than or equal to 5 μm to less than or equal to 50 μm, greater than or equal to 10 μm to less than or equal to 50 μm, greater than or equal to 25 μm to less than or equal to 50 μm, greater than or equal to 1 μm to less than or equal to 25 μm, greater than or equal to 5 μm to less than or equal to 25 μm, greater than or equal to 10 μm to less than or equal to 25 μm, greater than or equal to 1 m to less than or equal to 10 μm, greater than or equal to 5 μm to less than or equal to 10 μm, or greater than or equal to 1 μm to less than or equal to 5 μm.

The aspect ratio of the multilayer structures according to embodiments disclosed and described herein may be greater than or equal to 1 and less than or equal to 100 as measure by electron microscope (TEM, SEM), with both cross-section and surface being measured, based on a large population of flakes, such as greater than or equal to 5 and less than or equal to 100, greater than or equal to 10 and less than or equal to 100, greater than or equal to 20 and less than or equal to 100, greater than or equal to 30 and less than or equal to 100, greater than or equal to 40 and less than or equal to 100, greater than or equal to 50 and less than or equal to 100, greater than or equal to 60 and less than or equal to 100, greater than or equal to 70 and less than or equal to 100, greater than or equal to 80 and less than or equal to 100, greater than or equal to 90 and less than or equal to 100, greater than or equal to 1 and less than or equal to 90, greater than or equal to 5 and less than or equal to 90, greater than or equal to 10 and less than or equal to 90, greater than or equal to 20 and less than or equal to 90, greater than or equal to 30 and less than or equal to 90, greater than or equal to 40 and less than or equal to 90, greater than or equal to 50 and less than or equal to 90, greater than or equal to 60 and less than or equal to 90, greater than or equal to 70 and less than or equal to 90, greater than or equal to 80 and less than or equal to 90, greater than or equal to 1 and less than or equal to 80, greater than or equal to 5 and less than or equal to 80, greater than or equal to 10 and less than or equal to 80, greater than or equal to 20 and less than or equal to 80, greater than or equal to 30 and less than or equal to 80, greater than or equal to 40 and less than or equal to 80, greater than or equal to 50 and less than or equal to 80, greater than or equal to 60 and less than or equal to 80, greater than or equal to 70 and less than or equal to 80, greater than or equal to 1 and less than or equal to 70, greater than or equal to 5 and less than or equal to 70, greater than or equal to 10 and less than or equal to 70, greater than or equal to 20 and less than or equal to 70, greater than or equal to 30 and less than or equal to 70, greater than or equal to 40 and less than or equal to 70, greater than or equal to 50 and less than or equal to 70, greater than or equal to 60 and less than or equal to 70, greater than or equal to 1 and less than or equal to 60, greater than or equal to 5 and less than or equal to 60, greater than or equal to 10 and less than or equal to 60, greater than or equal to 20 and less than or equal to 60, greater than or equal to 30 and less than or equal to 60, greater than or equal to 40 and less than or equal to 60, greater than or equal to 50 and less than or equal to 60, greater than or equal to 1 and less than or equal to 50, greater than or equal to 5 and less than or equal to 50, greater than or equal to 10 and less than or equal to 50, greater than or equal to 20 and less than or equal to 50, greater than or equal to 30 and less than or equal to 50, greater than or equal to 40 and less than or equal to 50, greater than or equal to 1 and less than or equal to 40, greater than or equal to 5 and less than or equal to 40, greater than or equal to 10 and less than or equal to 40, greater than or equal to 20 and less than or equal to 40, greater than or equal to 30 and less than or equal to 40, greater than or equal to 1 and less than or equal to 30, greater than or equal to 5 and less than or equal to 30, greater than or equal to 10 and less than or equal to 30, greater than or equal to 20 and less than or equal to 30, greater than or equal to 1 and less than or equal to 20, greater than or equal to 5 and less than or equal to 20, greater than or equal to 10 and less than or equal to 20, greater than or equal to 1 and less than or equal to 10, greater than or equal to 5 and less than or equal to 10, or greater than or equal to 1 and less than or equal to 5.

The multilayer structures in embodiments disclosed herein can be used as pigments (e.g., paint pigments for a paint used to paint an object), or a continuous thin film applied to an object. When used as pigments, at least one of paint binders and fillers can be used and mixed with the pigments to provide a paint that displays a high chroma structural color. In addition, other additives may be added to the multilayer structure to aid the compatibility of multilayer structure in the paint system. Exemplary compatibility-enhancing additives include silane surface treatments that coat the exterior of the multilayer structure and improve the compatibility of multilayer structure in the paint system. Such paint systems or films can be used on any article, including an automotive vehicle.

EXAMPLES

Embodiments will be further clarified by the following examples.

As noted above, high volume ALD production can result in overlap of adjacent dielectric and absorber layers that can result in degraded optical properties of the multilayer structure. It is believed that this overlap occurs because of the high porosity of the dielectric layer (such as a $TiO_2$ layer), which allows overlap with the absorber layer (such as W layer) applied by ALD as the metal can be impregnated into the pores of the dielectric layer. With barrier or protective layer, all the layers are well separated, so their optical properties are well predicted by simulation.

Example 1

A multilayer structure was formed using ALD process. The multilayer structure included an aluminum reflective core layer, a conformal $SiO_2$ first protective layer encapsulating the reflective core layer, a conformal $TiO_2$ dielectric layer encapsulating the conformal $SiO_2$ protective layer, a conformal $Al_2O_3$ barrier layer encapsulating the conformal $TiO_2$ dielectric layer, and a conformal W absorber layer encapsulating the conformal $Al_2O_3$ barrier layer.

Figure 7A:
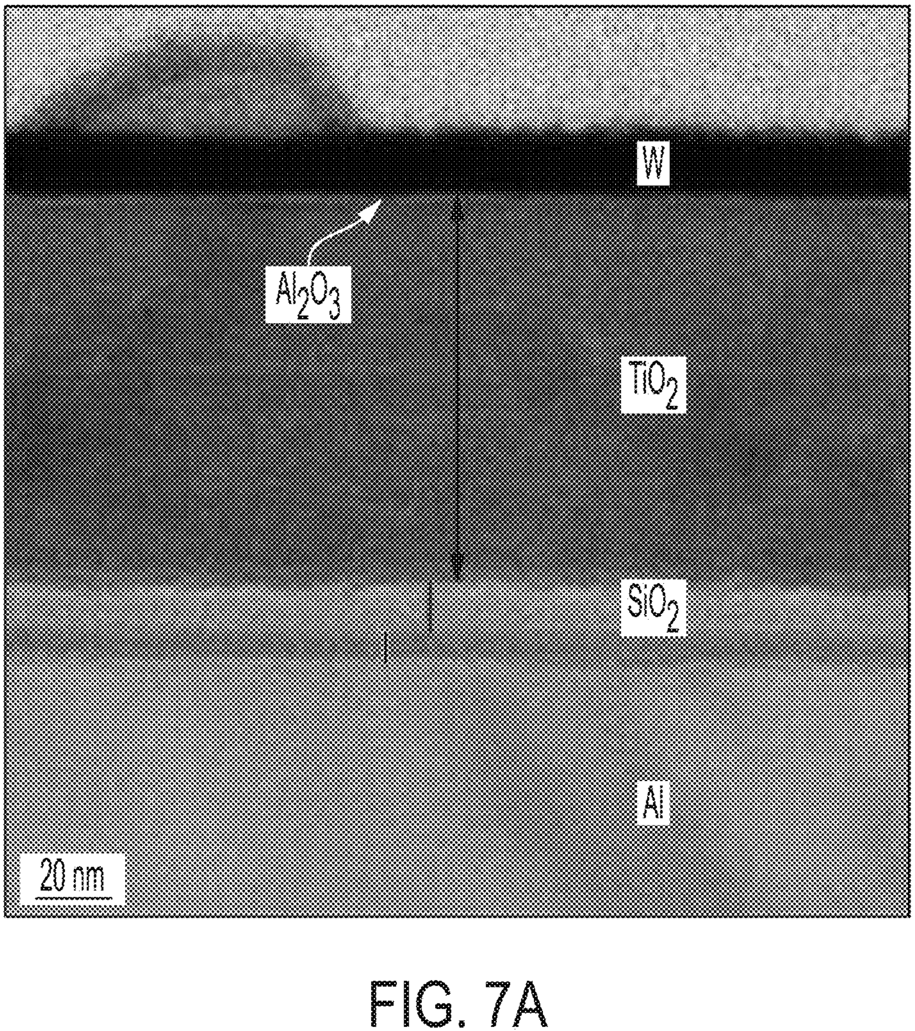
FIG. 7A is a transmission electron microscope (TEM) image of a multilayer structure according to embodiments disclosed and described herein that depicts well-separated metal and metal-oxide layers.
Figure 7B:
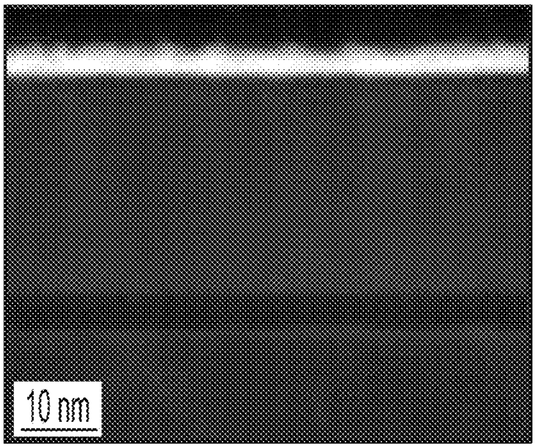
FIG. 7B is a further-magnified TEM image of the multilayer structure having a protective layer and a barrier layer according to embodiments disclosed and described herein.
Figure 7C:
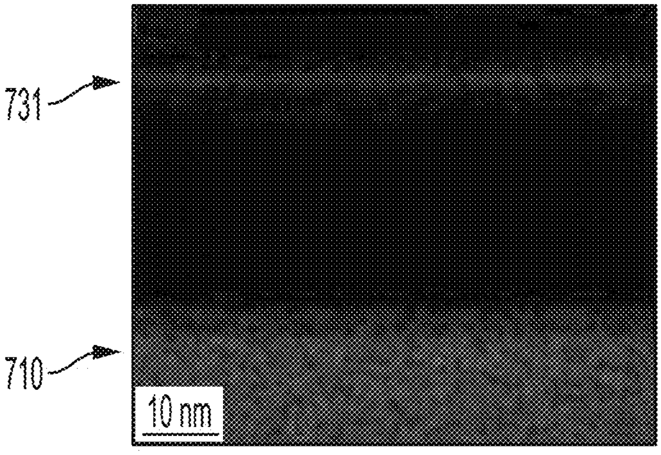
FIG. 7C is a TEM image with the elemental aluminum highlighted to show a distinct Al reflective core layer and a distinct $Al_2O_3$ barrier layer.
Figure 7D:
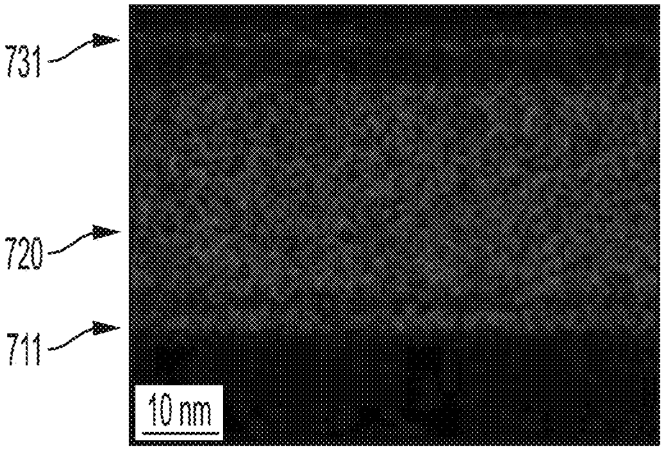
FIG. 7D is a TEM image with elemental oxygen highlighted to show a distinct $SiO_2$ protective layer, a distinct $TiO_2$ dielectric layer, and a distinct $Al_2O_3$ barrier layer.
Figure 7E:
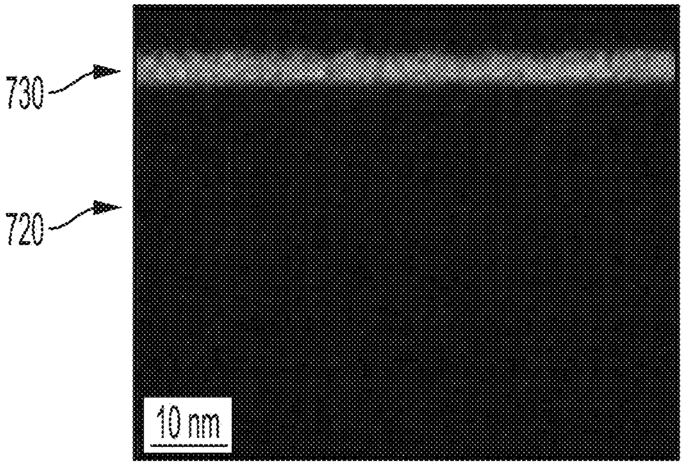
FIG. 7E is a TEM image with elemental tungsten highlighted to show a distinct W absorber layer with smooth surfaces and absent infiltration of W into the adjacent $TiO_2$ dielectric layer.
Figure 7F:
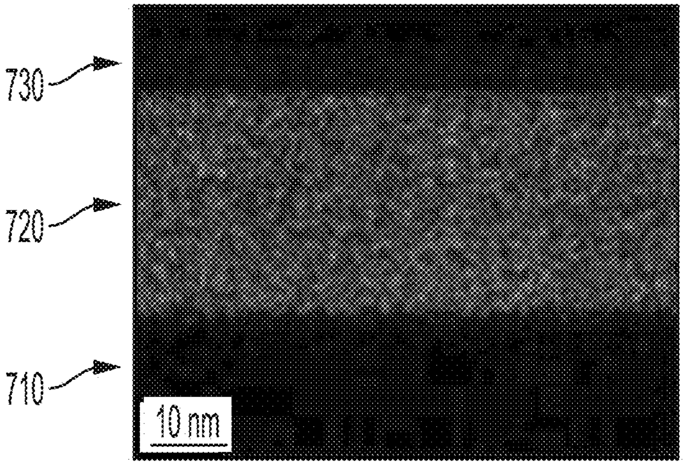
FIG. 7F is a TEM image with elemental titanium highlighted to show a distinct $TiO_2$ dielectric layer with smooth surfaces and absent infiltration of $TiO_2$ into the adjacent Al reflective core layer or W absorber layer.
Figure 8A:
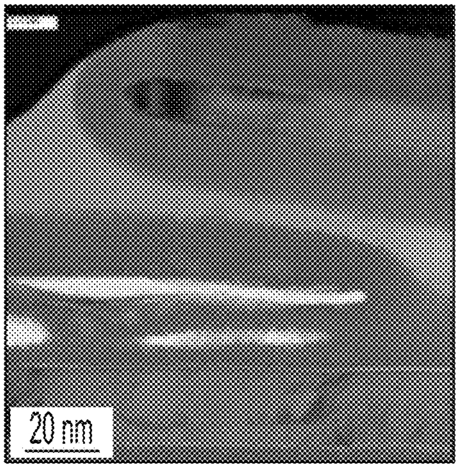
FIG. 8A is a TEM image of a multilayer structure comprising a $TiO_2$ dielectric layer encapsulating an Al reflective core layer.
Figure 8B:
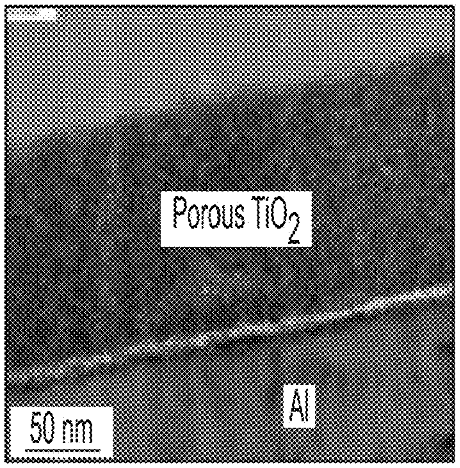
FIG. 8B is a further-magnified TEM image of a multilayer structure comprising a $TiO_2$ dielectric layer encapsulating an Al reflective core layer.
Figure 8C:
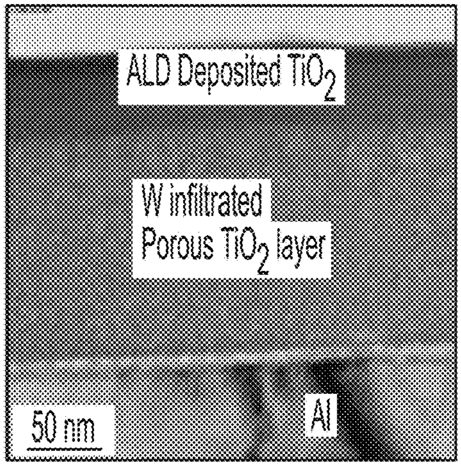
FIG. 8C is a TEM image of a multilayer structure comprising a $TiO_2$ dielectric layer encapsulating an Al reflective core layer and a W absorber layer encapsulating the $TiO_2$ dielectric layer without a barrier layer between the W absorber layer and $TiO_2$ dielectric layer.
Figure 8D:
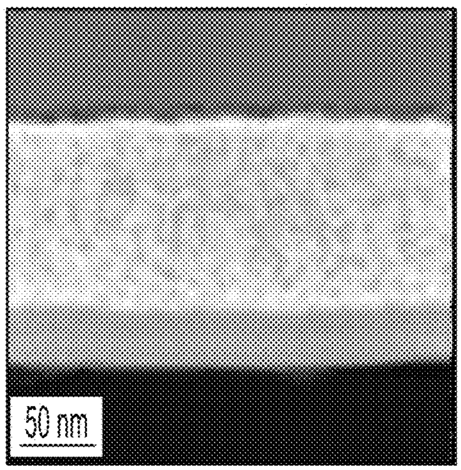
FIG. 8D is a further-magnified TEM image of a multilayer structure without a barrier layer and indicates the area to be analyzed by energy dispersive X-ray for elemental analysis.
Figure 8E:
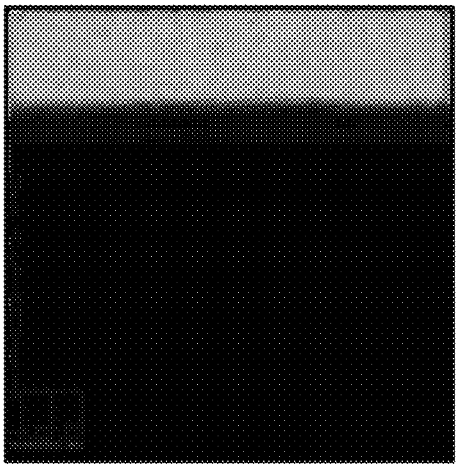
FIG. 8E is a TEM image of a multilayer structure without a barrier layer with elemental aluminum highlighted.
Figure 8F:
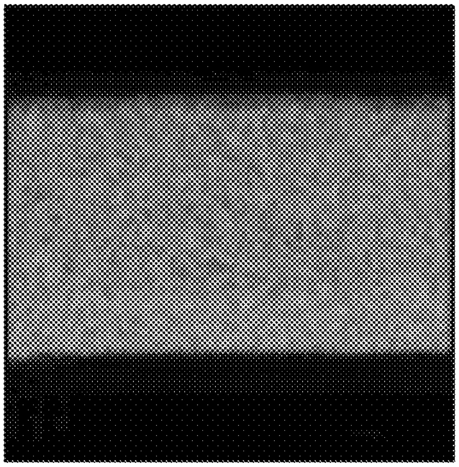
FIG. 8F is a TEM image of a multilayer structure without a barrier layer with elemental oxygen highlighted.
Figure 8G:
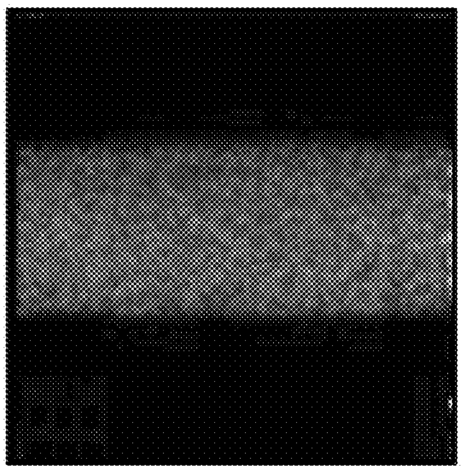
FIG. 8G is a TEM image of a multilayer structure without a barrier layer with elemental tungsten highlighted where tungsten was found to be dispersed throughout the $TiO_2$ layer.
Figure 8H:
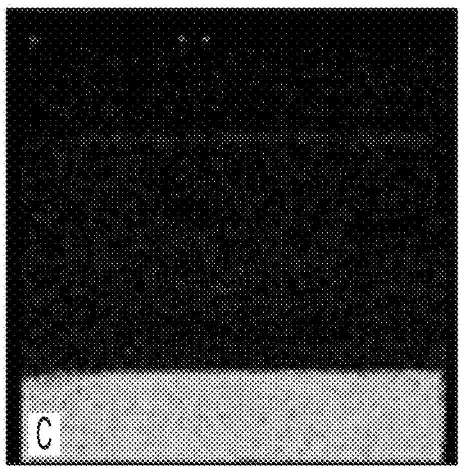
FIG. 8H is a TEM image of a multilayer structure without a barrier layer with elemental carbon highlighted.
Figure 8I:
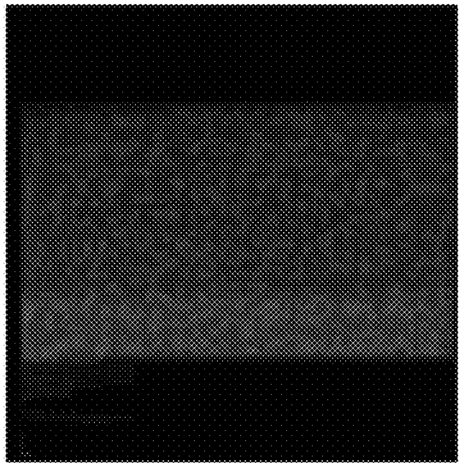
FIG. 8I is a TEM image of a multilayer structure without a barrier layer with elemental titanium highlighted.

FIG. 7A is a TEM image of the as-formed multilayer structure. As shown in FIG. 7A, each layer is distinct, separate, and has a smooth surface. FIG. 7B is a further-magnified TEM image of the as-formed multilayer structure and further shows the distinct, separate, and smooth layers. FIG. 7C is a TEM image with the elemental aluminum highlighted. FIG. 7C shows that the Al reflective core layer 710 is very distinct and has a smooth surface, and it also shows a distinct $Al_2O_3$ barrier layer 731, both of which have smooth surfaces. FIG. 7D is a TEM image with elemental oxygen highlighted. FIG. 7D shows a distinct $SiO_2$ protective layer 711, a distinct $TiO_2$ dielectric layer 720, and a distinct $Al_2O_3$ barrier layer 731 that all have smooth surfaces and there is not significant overlap between the various oxygen-containing layers. FIG. 7E is a TEM image with elemental tungsten highlighted. As shown in FIG. 7E, the W absorber layer 730 is distinct and has smooth surfaces. FIG. 7E also shows there is no infiltration of tungsten into the $TiO_2$ dielectric layer 720. FIG. 7F is a TEM image with elemental titanium highlighted. FIG. 7F shows a distinct $TiO_2$ dielectric layer 720 with smooth surfaces and no infiltration of $TiO_2$ into either the Al reflective core layer 710 or the W absorber layer 730.

Comparative Example 1

A multilayer structure was formed using ALD process. The multilayer structure included an aluminum reflective core layer, a conformal $SiO_2$ protective layer encapsulating the reflective core layer, a conformal $TiO_2$ dielectric layer encapsulating the conformal $SiO_2$ protective layer, and a conformal W absorber layer encapsulating the conformal $TiO_2$ dielectric layer. There is no barrier layer present between the $TiO_2$ dielectric layer and the W absorber layer.

FIG. 8 illustrates the infiltration of tungsten from a metal layer into an adjacent porous $TiO_2$ dielectric layer. Specifically, FIG. 8A is a TEM image of the multilayer structure before the W absorber layer was deposited and FIG. 8B is the magnified TEM figure of FIG. 8A. In FIG. 8B, the multilayer structure included an aluminum reflective core layer, a conformal $SiO_2$ protective layer encapsulating the reflective core layer, and a conformal $TiO_2$ dielectric layer encapsulating the conformal $SiO_2$ protective layer. As shown in FIG. 8B, the conformal $TiO_2$ dielectric layer appeared to be porous. FIG. 8C is a TEM image of the multilayer structure after the W absorber layer was deposited. As shown in FIG. 8C, tungsten from the W absorber layer infiltrated into the $TiO_2$ dielectric layer. FIG. 8D is a further-magnified TEM image of the multilayer structure and further shows the infiltration of W into the $TiO_2$ dielectric layer. FIG. 8E is a TEM image with the elemental aluminum highlighted. FIG. 8E shows that the Al reflective core layer 710 is very distinct and has a smooth surface, partially provided by the $SiO_2$ protective layer. FIG. 8F is a TEM image with elemental oxygen highlighted. FIG. 8F shows a denser oxygen concentration at the bottom of the $TiO_2$ dielectric layer (i.e., nearer the Al reflective core layer) where less tungsten was able to infiltrate. FIG. 8G is a TEM image with elemental tungsten highlighted. As shown in FIG. 8G, there is no protective layer and W infiltrated into the $TiO_2$. FIG. 8H is a TEM image of a multilayer structure without a barrier layer with elemental carbon highlighted; The carbon is the main component of the resin used to support the pigment; FIG. 8I is a TEM image with elemental titanium highlighted. FIG. 8I shows a higher concentration of Ti at the bottom of the $TiO_2$ dielectric layer (i.e., nearer the Al reflective core layer) where less tungsten was able to infiltrate.

As Example 1 and Comparative Example 1 above show, by depositing an $Al_2O_3$ barrier layer between the $TiO_2$ dielectric layer and the W absorber layer, the multilayer structure has well-separated dielectric and absorber layers that give rise to multilayer structure with improved chromaticity compared to a multilayer structure where no barrier layer is present between the $TiO_2$ dielectric layer and the W absorber layer.

Example 2

Figure 9:
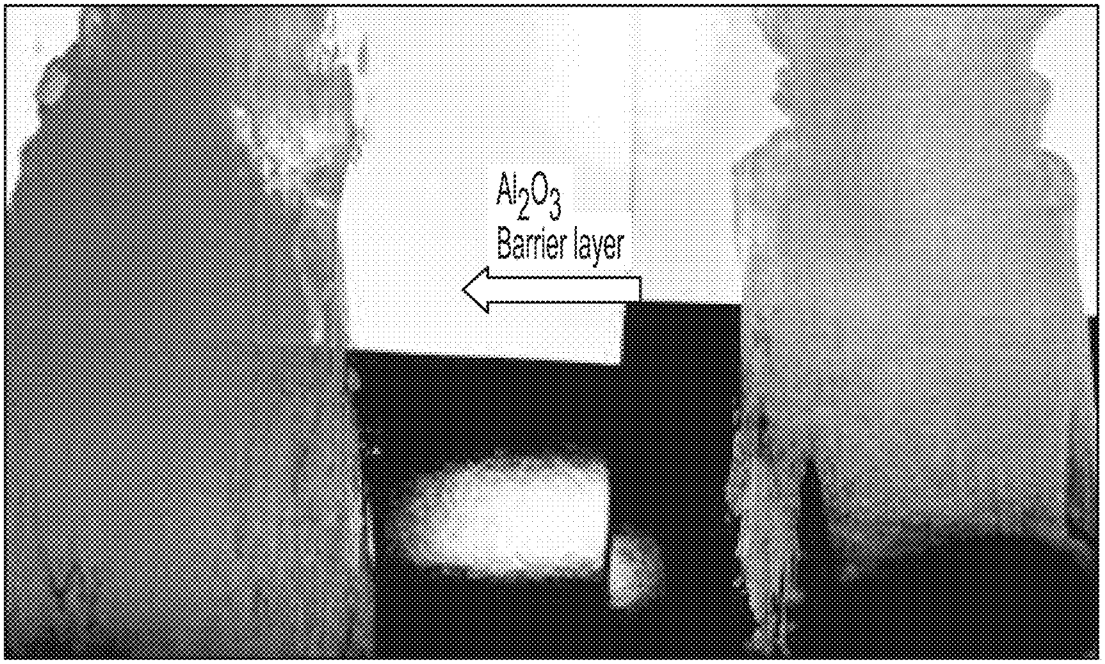
FIG. 9 is an image showing that structures with barrier layers have enhanced pigment chromaticity over the OSC multilayer structures without barrier layers.

Two paint systems were formed using multilayer structures described in Example 1 and Comparative Example 1. FIG. 9 compares the chromaticity of the two paint system. On the left of FIG. 9, the paint system was formed using multilayer structures described in Example 1. On the right of FIG. 9, the paint system was formed using multilayer structures described in Comparative Example 1. FIG. 9 shows that the paint system comprising multilayer structures described in Example 1 had a blue color with enhanced chroma, and in contrast, the paint system comprising multilayer structures described in Comparative Example 1 had a shifted blue hue and reduced chroma.

Example 3

Figure 10A:
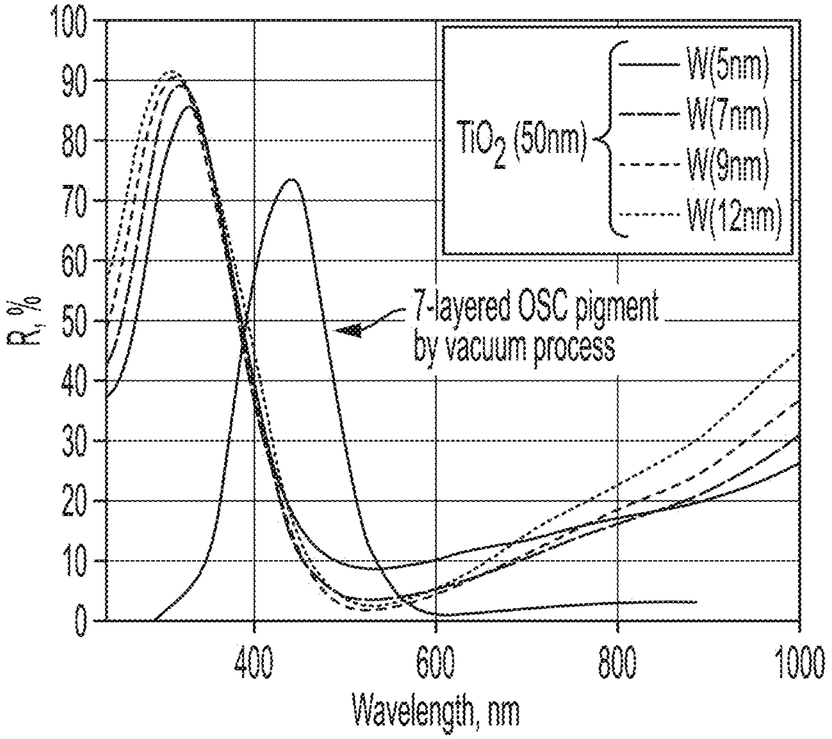
FIG. 10A is a graph of reflectance versus wavelength of electromagnetic radiation that shows the effect of the thickness of a tungsten absorber layer.
Figure 10B:
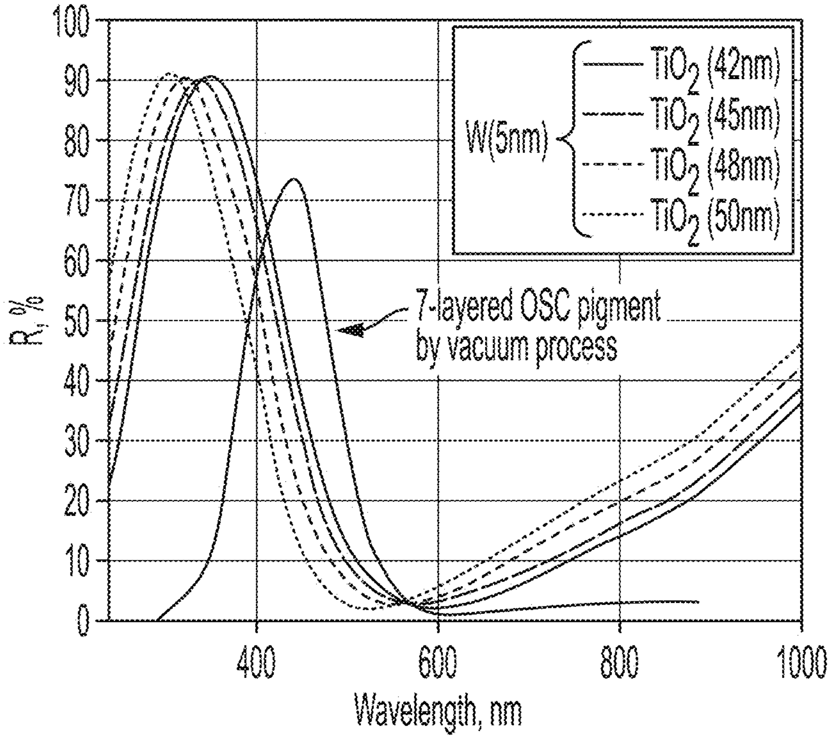
FIG. 10B is a graph of reflectance versus wavelength of electromagnetic radiation that shows the effect of the thickness of a $TiO_2$ dielectric layer.

The effects of the thicknesses for tungsten absorber layers and $TiO_2$ dielectric layers were studied in this example. FIGS. 10A and 10B show two sets of four multilayer structures comprising three optical layers deposited using ALD process. The three optical layers included an Al reflective core layer, a $TiO_2$ dielectric layer, and a W absorber layer.

FIG. 10A shows one set of the three-layer structures that comprised W absorber layers having thicknesses of 5 nm, 7 nm, 9 nm, and 12 nm and $TiO_2$ dielectric layers having a fixed thickness of 50 nm. As shown in FIG. 10A, as the thickness of the W absorber layer increased, the reflectance curve shifted slightly to the lower wavelengths and became more reflective. FIG. 10B shows one set of the three-layer structures that comprised W absorber layers having a fixed thickness of 5 nm and $TiO_2$ dielectric layers having thicknesses of 42 nm, 45 nm, 48 nm, and 50 nm. As shown in FIG. 10B, as the thickness of the titanium dioxide layer increased, the reflectance curve shifted slightly to the lower wavelengths.

Both sets of samples performed significantly better than a seven-layer structure formed by vacuum deposition.

Example 4

This example compares the density, surface area, and pore volumes of multilayer structures made using a ALD process and a wet chemical method. As shown in Table 1 below, the density of the multilayer structures made by the ALD and wet chemical methods were the same, but surface area of the multilayer structure was much smaller using the ALD method.

TABLE 1

| Property | ALD Method | Wet Chem. Method |
|---|---|---|
| Density | 2.8 $g/cm^3$ | 2.8 $g/cm^3$ |
| Surface Area (BET) | 3.6 $m^2/g$ | 109.2 $m^2/g$ |
| Pore Volume (BET) | 0.005 $cm^3/g$ | 0.036 $cm^3/g$ |

The density of the pigment is the ratio of the mass of the pigment sample and its volume including the contribution of the interparticulate void volume. To measure this, a glass cylinder with specific volume was used and known mass of pigments were introduced into the cylinder. The volume was estimated by addition of DI water into the cylinder until the water reach the volume line of cylinder. By measuring the weight of how much DI water was added, the volume of water was obtained. The sample volume was obtained by subtracting the volume of water with total volume of cylinder. Replicate experiments were performed for the determination of the density. Full adsorption/desorption isotherms were collected over samples, after degassing at 90° C. for one hour, and then degassing at 150° C. for three hours. The isotherms were collected using nitrogen physisorption at 76 K to obtain the specific surface area (SSA) of the materials, by fitting 13 points collected from $P/P_0 \approx 0.06-0.3$ to the Brunauer-Emmett-Teller (BET) equation. Additional adsorption points were collected at various $P/P_0$, up to $P/P_0 \approx 0.95$, followed by desorption back to $P/P_0 \approx 0.06$. The total pore volume was determined by the volume of nitrogen adsorbed at $P/P_0 \approx 0.95$, and average pore diameter was calculated using the Barrett Joyner Halenda (BJH) method.

It will be apparent to those skilled in the art that various modifications and variations can be made to the embodiments described herein without departing from the spirit and scope of the claimed subject matter. Thus, it is intended that the specification cover the modifications and variations of the various embodiments described herein provided such modification and variations come within the scope of the appended claims and their equivalents.

What is claimed is:

1. A method of forming a plurality of encapsulated multilayer structures that reflect an omnidirectional structural color by atomic layer deposition (ALD), comprising:

introducing a plurality of reflective core particles into a reaction chamber;

depositing a conformal dielectric layer encapsulating each reflective core particle of the plurality of reflective core particles in a dielectric-layer ALD cycle;

depositing a conformal barrier layer encapsulating the conformal dielectric layer of the each reflective core particle of the plurality of reflective core particles in a barrier-layer ALD cycle; and depositing a conformal absorber layer encapsulating the conformal barrier layer of the each reflective core particle of the plurality of reflective core particles in an absorber-layer ALD cycle, wherein each encapsulated multilayer structure of the plurality of the encapsulated multilayer structures has a $D_{50}$ diameter greater than or equal to 1 μm and less than or equal to 500 μm.

2. The method of claim 1, wherein the each reflective core particle of the plurality of reflective core particles comprises a conformal protective layer encapsulating the each reflective core particle of the plurality of reflective core particles.

3. The method of claim 2, wherein the conformal protective layer is formed by ALD, chemical vapor deposition (CVD), or wet chemistry methods.

4. The method of claim 1, further comprising depositing a conformal outer protective layer encapsulating the conformal absorber layer of the each reflective core particle of the plurality of reflective core particles in an outer-protective-layer ALD cycle.

5. The method of claim 1, further comprising depositing a second conformal barrier layer encapsulating the conformal absorber layer of the each reflective core particle of the plurality of reflective core particles in a second barrier-layer ALD cycle; and depositing a second conformal dielectric layer encapsulating the second conformal barrier layer of the each reflective core particle of the plurality of reflective core particles in a second dielectric-layer ALD cycle.

6. The method of claim 5, further comprising depositing a conformal outer protective layer encapsulating the second conformal dielectric layer of the each reflective core particle of the plurality of reflective core particles in an outer-protective-layer ALD cycle.

7. The method of claim 1, wherein the dielectric-layer ALD cycle comprises, in sequence:

supplying a first component selected from the group consisting of halides, alkyl, alkoxides, alkylamides, and carbonyls of Ti, Zn, Zr, Hf, Fe, Al, Pb, Ga, In, Si, Mg, K, and combinations thereof into the reaction chamber;

purging the reaction chamber with a purge gas selected from the group consisting of nitrogen, argon, and combinations thereof, supplying a second component selected from the group consisting of $O_2$, $O_3$, $H_2O$, $H_2O_2$, $As_2O_3$, $As_2O_5$, $H_2S$, $S_2$, $Br_2$, HF, $NH_4F$, $SF_6$, and combinations thereof into the reaction chamber; and purging the reaction chamber with a purge gas selected from the group consisting of nitrogen, argon, and combinations thereof.

8. The method of claim 1, wherein the barrier-layer ALD cycle comprises, in sequence:

supplying a first component is selected from the group consisting of halides, alkyl, alkoxides, alkylamides, and carbonyls of Al, Si, Mg, K, Zn, and combinations thereof into the reaction chamber;

purging the reaction chamber purged with a purge gas selected from the group consisting of nitrogen, argon, and combinations thereof, supplying a second component selected from the group consisting of $O_2$, $O_3$, $H_2O$, $H_2O_2$, $Br_2$, HF, $NH_4F$, and combinations thereof into the reaction chamber; and purging the reaction chamber is purged with a purge gas selected from the group consisting of nitrogen, argon, and combinations thereof.

9. The method of claim 1, wherein the absorber-layer ALD cycle comprises, in sequence:

supplying a first component selected from the group consisting of halides, alkyl, alkoxides, alkylamides, and carbonyls of W, Cr, Ge, Ni, Pd, Ti, Si, V, Co, Mo, Nb, and combinations thereof into the reaction chamber;

purging the reaction chamber with a purge gas selected from the group consisting of nitrogen, argon, and combinations thereof, supplying a second component selected from the group consisting of $SiH_4$, $Si_2H_6$, $BH_3$, $B_2H_6$, $H_2$, $N_2$, $NH_3$, $O_2$, $O_3$, $H_2O$, $H_2O_2$, and combinations thereof into the reaction chamber; and purging the reaction chamber with a purge gas selected from the group consisting of nitrogen, argon, and combinations thereof.

10. The method of claim 4, wherein the outer-protective-layer ALD cycle comprises, in sequence:

supplying a first component selected from the group consisting of halides, alkyl, alkoxides, alkylamides, and carbonyls of Al, Si, Mg, K, Zn, and combinations thereof into the reaction chamber;

purging the reaction chamber with a purge gas selected from the group consisting of nitrogen, argon, and combinations thereof, supplying a second component selected from the group consisting of $O_2$, $O_3$, $H_2O$, $H_2O_2$, $Br_2$, HF, $NH_4F$, and combinations thereof into the reaction chamber;

purging the reaction chamber with a purge gas selected from the group consisting of nitrogen, argon, and combinations thereof, supplying trimethyl aluminum and water into the reaction chamber; and purging the reaction chamber with a purge gas selected from the group consisting of nitrogen, argon, and combinations thereof.

11. The method of claim 5, wherein the second barrier-layer ALD cycle comprises, in sequence supplying a first component selected from the group consisting of halides, alkyl, alkoxides, alkylamides, and carbonyls of Al, Si, Mg, K, Zn, and combinations thereof into the reaction chamber;

purging the reaction chamber with a purge gas selected from the group consisting of nitrogen, argon, and combinations thereof, supplying a second component selected from the group consisting of $O_2$, $O_3$, $H_2O$, $H_2O_2$, $Br_2$, HF, $NH_4F$, and combinations thereof into the reaction chamber; and purging the reaction chamber with a purge gas selected from the group consisting of nitrogen, argon, and combinations thereof.

12. The method of claim 5, wherein the second dielectric-layer ALD cycle comprises, in sequence:

supplying a first component selected from the group consisting of halides, alkyl, alkoxides, alkylamides, and carbonyls of Ti, Zn, Zr, Hf, Fe, Al, Pb, Ga, In, Si, Mg, K, and combinations thereof into the reaction chamber;

purging the reaction chamber with a purge gas selected from the group consisting of nitrogen, argon, and combinations thereof, supplying a second component selected from the group consisting of $O_2$, $O_3$, $H_2O$, $H_2O_2$, $As_2O_3$, $As_2O_5$, $H_2S$, $S_2$, $Br_2$, HF, $NH_4F$, $SF_6$, and combinations thereof into the reaction chamber; and purging the reaction chamber with a purge gas selected from the group consisting of nitrogen, argon, and combinations thereof.

13. The method of claim 1, wherein the reaction chamber, in each of the dielectric-layer ALD cycle, the barrier-layer ALD cycle, and the absorber-layer ALD cycle individually, comprises:

a pressure that is greater than or equal to 13 pascals and less than or equal to 2666 pascals; and a temperature that is greater than or equal to 60° C. and less than or equal to 150° C.

14. The method of claim 5, wherein the reaction chamber, in each of the second barrier-layer ALD cycle and the second dielectric-layer ALD cycle individually, comprises:

a pressure that is greater than or equal to 13 pascals and less than or equal to 2666 pascals; and a temperature that is greater than or equal to 60° C. and less than or equal to 150° C.

15. The method of claim 1, wherein the each reflective core particle of the plurality of reflective core particles is selected from the group consisting of Au, Cu, Al, brass, bronze, TiN, Cr, stainless steel, alumina ($Al_2O_3$), silica ($SiO_2$), bismuth oxychloride, glass materials, mica, and combinations thereof.

16. The method of claim 1, wherein the conformal dielectric layer is selected from the group consisting of $TiO_2$, ZnS, $ZrO_2$, $HfO_2$, $Fe_3O_4$, AlAs, $Fe_2O_3$, PbS, GaAs, InAs, $SiO_2$, $MgF_2$, KBr, ZnO, $Al_2O_3$, and combinations thereof;

the conformal barrier layer is selected from the group consisting of $Al_2O_3$, $SiO_2$, $MgF_2$, KBr, ZnO, and combinations thereof, and the conformal absorber layer is selected from the group consisting of W, Cr, Ge, Ni, stainless steel, Pd, Ti, Si, V, TiN, Co, Mo, Nb, ferric oxide, and combinations thereof.

17. The method of claim 4, wherein the conformal outer protective layer is selected from the group consisting of $SiO_2$, $Al_2O_3$, organosilane, organic phosphine, phosphates, and combinations thereof.

18. The method of claim 5, wherein the second conformal barrier layer is selected from the group consisting of $Al_2O_3$, $SiO_2$, $MgF_2$, KBr, ZnO, and combinations thereof, and the second conformal dielectric layer is selected from the group consisting of $TiO_2$, ZnS, $ZrO_2$, $HfO_2$, $Fe_3O_4$, AlAs, $Fe_2O_3$, PbS, GaAs, InAs, $SiO_2$, $MgF_2$, KBr, ZnO, $Al_2O_3$, and combinations thereof.

19. The method of claim 6, wherein the conformal outer protective layer is selected from the group consisting of $SiO_2$, $Al_2O_3$, organosilane, organic phosphine, phosphates, and combinations thereof.

20. The method of claim 1, wherein the conformal dielectric layer has a thickness that is greater than or equal to 5 nm and less than or equal to 500 nm;

the conformal barrier layer has a thickness that is less than or equal to 50 nm; and the conformal absorber layer has a thickness that is greater than or equal to 2 nm and less than or equal to 50 nm.

21. The method of claim 5, wherein the second conformal barrier layer has a thickness that is less than or equal to 50 nm; and the second conformal dielectric layer has a thickness that is greater than or equal to 5 nm and less than or equal to 500 nm.

* * * * *